United States Patent
Mezouari et al.

(10) Patent No.: US 12,349,515 B2
(45) Date of Patent: Jul. 1, 2025

(54) MULTICOLOUR LIGHT EMITTING STRUCTURE

(71) Applicant: PLESSEY SEMICONDUCTORS LTD, Plymouth (GB)

(72) Inventors: Samir Mezouari, Plymouth (GB); Andrea Pinos, Plymouth (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 503 days.

(21) Appl. No.: 17/798,546

(22) PCT Filed: Feb. 9, 2021

(86) PCT No.: PCT/GB2021/050294
§ 371 (c)(1),
(2) Date: Aug. 9, 2022

(87) PCT Pub. No.: WO2021/161005
PCT Pub. Date: Aug. 19, 2021

(65) Prior Publication Data
US 2023/0085036 A1    Mar. 16, 2023

(30) Foreign Application Priority Data
Feb. 11, 2020  (GB) ..................................... 2001876

(51) Int. Cl.
*H01L 33/38*        (2010.01)
*H10H 20/01*       (2025.01)
(Continued)

(52) U.S. Cl.
CPC ...... *H10H 20/8312* (2025.01); *H10H 20/018* (2025.01); *H10H 20/812* (2025.01);
(Continued)

(58) Field of Classification Search
CPC ............. H10H 20/8312; H10H 20/831; H10H 20/018; H10H 20/01; H10H 20/812;
(Continued)

(56) References Cited

U.S. PATENT DOCUMENTS 7,271,420 B2 *   9/2007   Cao ........................ H10H 29/10
                                                                    257/89
8,163,581 B1     4/2012   Or-Bach et al.
(Continued)

FOREIGN PATENT DOCUMENTS

| TW | 201342657 A | 10/2013 |
| TW | 201817034 A | 5/2018 |
| WO | 2018/010833 A1 | 1/2018 |

OTHER PUBLICATIONS

International Search Report in PCT International Application No. PCT/GB2021/050294, mailed May 17, 2021.
(Continued)

*Primary Examiner* — Nikolay K Yushin
(74) *Attorney, Agent, or Firm* — Cognition IP, P.C.; Edward Steakley

(57) ABSTRACT

A method of forming a light emitting structure, the light emitting structure comprising: a first light emitting region configured to emit light having a first primary peak wavelength; a second light emitting region configured to emit light having a second primary peak wavelength, wherein the first primary peak wavelength is different to the second primary peak wavelength; and a partially reflective layer positioned at least partially between the first light emitting region and the second light emitting region, wherein the partially reflective layer is configured to reflect light having the first primary peak wavelength emitted by the first light emitting region and allow light having the second primary
(Continued)

peak wavelength emitted by the second light emitting region to pass through the partially reflective layer.

18 Claims, 19 Drawing Sheets

(51) Int. Cl.
  *H10H 20/812* (2025.01)
  *H10H 20/825* (2025.01)
  *H10H 20/831* (2025.01)
  *H10H 20/841* (2025.01)
(52) U.S. Cl.
  CPC ........ *H10H 20/825* (2025.01); *H10H 20/841* (2025.01); *H10H 20/032* (2025.01); *H10H 20/034* (2025.01)
(58) Field of Classification Search
  CPC .. H10H 20/825; H10H 20/841; H10H 20/032; H10H 20/034; H10H 20/813; H10H 20/817; H10H 20/833; H10H 20/01335; H10H 20/0137; H10H 20/814; H10H 20/013; H10H 20/824; H10H 20/8215; H01L 24/31; H01L 24/66; H01L 24/49; H01L 23/00; H01L 23/66; H01L 25/075; H01L 25/0753; H01L 25/0756; H01L 33/26; H01L 33/486; H01L 33/0008
  See application file for complete search history.

(56) References Cited

U.S. PATENT DOCUMENTS

| | | | | |
|---|---|---|---|---|
| 8,753,913 | B2* | 6/2014 | Or-Bach | H10F 10/161 |
| | | | | 438/459 |
| 11,043,792 | B2* | 6/2021 | Han | H01S 5/1042 |
| 12,184,329 | B2* | 12/2024 | Ooi | H04B 10/2519 |
| 2006/0027820 | A1* | 2/2006 | Cao | H10H 20/8312 |
| | | | | 257/89 |
| 2012/0025237 | A1 | 2/2012 | Lai | |
| 2012/0231572 | A1* | 9/2012 | Or-Bach | H10F 71/139 |
| | | | | 438/73 |
| 2017/0237234 | A1* | 8/2017 | Han | H01S 5/187 |
| | | | | 372/45.012 |
| 2018/0090645 | A1 | 3/2018 | Nelson et al. | |
| 2023/0047142 | A1* | 2/2023 | Ooi | H04B 10/116 |

OTHER PUBLICATIONS

Combined Search and Examination Report for Application No. GB2001876.8, Jun. 18, 2020.

Office Action received in TW patent application No. 110105156, mailed Apr. 14, 2023.

* cited by examiner

300A

| H-Si | 114 |
| Bonding | 112 |
| p-GaN | 110 |
| B MQWs | 108 |
| n-GaN | 106 |
| DBR | 104 |
| Bonding | 304 |
| ITO | 302 |
| p-GaN | 210 |
| G MQWs | 208 |
| n-GaN | 206 |
| DBR | 204 |
| G-Si | 202 |

| p-GaN | 110 |
| B MQWs | 108 |
| n-GaN | 106 |
| DBR | 104 |
| Bonding | 304 |
| ITO | 302 |
| p-GaN | 210 |
| G MQWs | 208 |
| n-GaN | 206 |
| DBR | 204 |
| G-Si | 202 |

| H-Si | 516 |
| Bonding | 514 |
| ITO | 512 |
| p-GaN | 510 |
| G MQWs | 508 |
| n-GaN | 506 |
| DBR | 504 |
| Bonding | 702 |
| ITO | 612 |
| p-Cladding | 610 |
| R MQWs | 608 |
| n-Cladding | 606 |
| DBR | 604 |
| G-Si | 602 |

| ITO | 512 |
| p-GaN | 510 |
| G MQWs | 508 |
| n-GaN | 506 |
| DBR | 504 |
| Bonding | 702 |
| ITO | 612 |
| p-Cladding | 610 |
| R MQWs | 608 |
| n-Cladding | 606 |
| DBR | 604 |
| G-Si | 602 |

MULTICOLOUR LIGHT EMITTING STRUCTURE

CROSS-REFERENCE TO RELATED APPLICATIONS

This application is a 35 U.S.C. § 371 national stage application of PCT International Application No. PCT/GB2021/050294, filed on Feb. 9, 2021, which claims the benefit of Great Britain Application No. 2001876.8, filed Feb. 11, 2020, which are hereby incorporated by reference in their entirety.

FIELD OF THE INVENTION

The invention relates to light emitting structures and methods of forming light emitting structures. In particular, but not exclusively, the invention relates to overlaid multicolour light emitting diode structures.

BACKGROUND OF THE INVENTION

It is known that light emitting diode (LED) devices provide efficient sources of light for a wide range of applications. Increases in LED light generation efficiency and extraction, along with the production of smaller LEDs (with smaller light emitting surface areas) and the integration of different wavelength LED emitters into arrays, has resulted in the provision of high quality colour arrays with multiple applications, in particular in display technologies.

Typically, such arrays require control of red, green and blue light emission. Such red-green-blue (RGB) emission is usually provided by either LEDs that natively emit light of different primary peak wavelengths, or by LEDs that convert one primary peak wavelength to at least one other primary peak wavelength using a colour conversion material, such as a phosphor. For example, in some examples, a blue LED might be selectively coupled with phosphors to provide RGB emission.

Beneficially, the use of native RGB LED emitters means that light colour conversion is not required and therefore no light is lost through a colour conversion process. However, in arrays of LED emitters that emit multiple colours of light, for example where some of the LEDs emit light with a primary peak wavelength that is red, some of the LEDs emit light with a primary peak wavelength that is green and some LEDs emit light with a primary peak wavelength that is blue, certain challenges are encountered.

For example, where the light emitting surface area of a single pixel LED device is dedicated to a single colour primary peak wavelength, and where three colours are required to provide red, green and blue light emission, often, only a relatively small portion of the light emitting surface area may be in use at a time, depending on the required light output composition. Accordingly, the fill factor (the light emitting area of the array/display as a percentage of the total array/display area) may be relatively poor. Further, where multiple, different colour light emitters are used, the effective pixel pitch is the sum of the area for each colour light emitter and hence the resolution of the LED array, or display, for example, is reduced in line with the effective pixel pitch.

SUMMARY OF THE INVENTION

In order to mitigate for at least some of the above-described problems, there is provided:

A method of forming a light emitting structure, the light emitting structure comprising: a first light emitting region configured to emit light having a first primary peak wavelength; a second light emitting region configured to emit light having a second primary peak wavelength, wherein the first primary peak wavelength is different to the second primary peak wavelength; and a partially reflective layer positioned at least partially between the first light emitting region and the second light emitting region, wherein the partially reflective layer is configured to reflect light having the first primary peak wavelength emitted by the first light emitting region and allow light having the second primary peak wavelength emitted by the second light emitting region to pass through the partially reflective layer.

Further, there is provided a light emitting structure comprising: a first light emitting region configured to emit light having a first primary peak wavelength; a second light emitting region configured to emit light having a second primary peak wavelength, wherein the first primary peak wavelength is different to the second primary peak wavelength; and a partially reflective layer positioned at least partially between the first light emitting region and the second light emitting region, wherein the partially reflective layer is configured to reflect light having the first primary peak wavelength emitted by the first light emitting region (thereby to reduce illumination of the second light emitting region by the first light emitting region) and allow light having the second primary peak wavelength emitted by the second light emitting region to pass through the partially reflective layer.

Advantageously, forming a light emitting structure in such a manner enables very good colour uniformity over a common emitting area. Further, beneficially, forming a light emitting structure in such a manner enables higher resolution in arrays of the light emitting structures to be achieved via reduced pixel pitch in multicolour arrays, as light can be emitted by a common emitting area. Further, beneficially, the method provides a light emitting structure with increased brightness and reduced photoluminescence, as the partially reflective layer separates different wavelengths of light emission and prevents excitation of one light emitting region by another light emitting region.

Preferably, the second primary peak wavelength is longer than the first primary peak wavelength. Advantageously, since the second primary peak wavelength is longer than the first primary peak wavelength, light emitted from the second light emitting region passes through the partially reflective layer and out of the light emitting structure without and light emitted from the first light emitting region does not pass through the partially reflective layer and therefore does not illuminate the second light emitting region.

Preferably, the light emitting structure comprises a primary light emitting surface area wherein the light having the first primary peak wavelength and the second primary peak wavelength are emitted from the light emitting structure via the primary light emitting surface area. Beneficially, the light emitting structure has a common light emitting surface for multiple, different, wavelengths of light. Advantageously, where the light emitting surface forms the light emitting surface of a pixel, reduced pixel pitch is enabled as the multiple wavelengths of light emit from the same area.

Preferably, the method comprises bonding a first light emitting device comprising the first light emitting region configured to emit light having the first primary peak wavelength to a second light emitting device comprising the second light emitting region configured to emit light having the second primary peak wavelength. Advantageously, the first light emitting device and the second light emitting device can be grown independently, with independently optimised conditions. Beneficially, the first and second light emitting devices can be grown to include layers that are incorporated in the bonded structure with reduced steps.

Preferably the first light emitting device and the second light emitting device are light emitting diode devices each comprising a light emitting region, an n-type region and a p-type region and wherein the first light emitting region and the second light emitting region comprise at least one epitaxial quantum well. Advantageously, independently grown, and optimised, light emitting diode structures are bonded to form a multicolour light emitting diode device structure.

Preferably, at least one of the first light emitting device and the second light emitting device comprises the partially reflective layer. Advantageously, the partially reflective layer is included in at least one of the first light emitting device and the second light emitting device such that when the first and second light emitting devices are bonded together, the number of method steps are reduced as the partially reflective layer is provided in a position that provides advantageous features when the light emitting devices are bonded together.

Preferably, the partially reflective layer comprises a Distributed Bragg Reflector (DBR). Advantageously, DBRs are efficiently incorporated into light emitting structures in a way that enables the partially reflective properties of the partially reflective layer to be implemented whilst maintaining the crystalline quality of the light emitting structure, not least since the DBR can form part of the growth process for producing a light emitting diode structure.

Preferably, the light emitting structure comprises a third light emitting region configured to emit light having a third primary peak wavelength, wherein the third primary peak wavelength is different to the first and second primary peak wavelengths. Advantageously, a third primary peak wavelength of light enables three different wavelengths of light to be emitted from the same light emitting structure. Beneficially, red-green-blue (RGB) colour emission is implemented using three different light emitting regions in the light emitting structure.

Preferably, the method comprises a second partially reflective layer positioned at least partially between the second light emitting region and the third light emitting region, wherein the partially reflective layer is configured to reflect light having the first primary peak wavelength emitted by the first light emitting region and light having the second primary peak wavelength emitted by the second light emitting region and allow light having the third primary peak wavelength emitted by the third light emitting region to pass through. Advantageously, the light emitted by the second light emitting region is reflected by the second partially reflective layer and passes through the first light emitting region, and light emitted by the third light emitting region passes through the second light emitting region. Therefore, all of the emitted light passes through the same light emitting surface of the light emitting structure for emission.

Preferably, bonding comprises using a handling device to facilitate positioning of the first light emitting device in relation to the second light emitting device. Advantageously, the use of the handling device means that the formation of the light emitting structure can be implemented in an efficient manner. Preferably, the method comprises bonding the handling device to the first light emitting device. Beneficially, the first light emitting device can then be easily moved and positioned relative to the second light emitting device, for ease of processing to provide the light emitting structure that has multiple wavelengths of primary peak wavelength light emitted from the same side of the light emitting structure.

Preferably, the first light emitting device and/or the second light emitting device comprise a substrate. Advantageously, the first and/or second light emitting devices are formed on a substrate independently to provide high quality material.

Preferably, the method comprises removing the substrate of the first light emitting device and/or the second light emitting device, preferably using a wet etch, thereby to provide a surface for bonding the first light emitting device and second light emitting device. Advantageously, the substrate is removed to provide the surface to be bonded, once the first and/or second light emitting device has been formed on its substrate. Therefore, high quality material for the first and/or second light emitting device is provided, independently, and surfaces of the first and second light emitting devices bonded, to form a single structure that may not have the same material integrity throughout, had it been formed on one substrate.

Preferably, the method comprises removing the substrate of the first light emitting device prior to bonding the first light emitting device and the second light emitting device. Advantageously, the substrate is chosen for its suitability to form the first light emitting device and not its physical properties that may otherwise inhibit the performance of the formed light emitting structure.

Preferably, the method comprises removing the handling device after the first light emitting device and the second light emitting device have been bonded together. Advantageously, the handling device is removed once the structure has been formed, such that the handling means to aid forming the structure does not inhibit the performance of the light emitting structure once formed.

Preferably, the method comprises disposing a transparent conductive layer on the first light emitting device. Advantageously, the transparent conductive layer provides a layer that enables light to pass through it whilst still providing electrical properties that, when bonded to a second light emitting device, enable improved electrical injection in the second light emitting device.

Preferably, the method comprises bonding a further handling device to the transparent conductive layer thereby to facilitate formation of electrodes in the light emitting structure. Advantageously, the use of a handling device means that other parts of the structure can be processed, for example, growth substrates can be removed for further processing of the light emitting structure.

Preferably, the method comprises forming one or more electrodes. Advantageously, the electrodes are formed to enable electrical injection into the different light emitting regions, thereby enabling selective control of the light emission from the light emitting structure.

Preferably, the method comprises forming at least one of one or more electrodes by etching a via hole. Advantageously, the via hole is etched in the formed structure, such that separate light emitting regions are formed in separate, optimised, processes and the bonded, formed, light emitting structure is etched through to provide the via in one step, thereby reducing the number of processing steps whilst providing controlled electrical connection of the light emitting regions.

Preferably, the method comprises forming an insulating surface on at least part of the inner wall of the via hole.

Beneficially, the via hole passes through the structure in a manner that avoids inadvertent electrical connection with unintended layers, whilst providing a continuous process in a formed light emitting structure.

Preferably, the method comprises forming a conductor at least partially within the via hole thereby to enable formation of a contact. Advantageously, electrical connection is made after the formation of the light emitting structure, in order to provide reduced processing and improved connections through more efficient processing.

Preferably, the handling layer is bonded on the opposite side of the light emitting structure to the substrate. Advantageously, the use of the handling layer bonded on the opposite side of the light emitting structure to the substrate enables the substrate to be removed whilst providing means to move the light emitting structure.

Preferably, the method comprises bonding the partially reflective layer to a second light emitting device formed on a second substrate. Advantageously, the partially reflective layer is positioned between the first light emitting region and the second light emitting region, thereby controlling reflection and transmission of light between the first light emitting region and the second light emitting region.

Preferably, the method comprises bonding the partially reflective layer to a transparent conductive layer of the second light emitting device. Advantageously, light emitted from the first light emitting region is reflected by the partially reflective layer and light emitted from the second light emitting region passes through the transparent conductive layer and the partially reflective layer, whilst improved conductivity is provided in the second light emitting device.

Preferably, the light emitting structure comprises a Gallium Nitride based structure. Advantageously, Gallium Nitride is known for its properties in providing high quality light emitting diode devices.

Preferably, the light emitting structure is at least partially grown by metalorganic chemical vapour deposition.

Preferably, the first light emitting region and/or second light emitting region comprises one or more epitaxial quantum well layers. Preferably, the light emitting structure comprises one or more crystalline epitaxial compound semiconductor layers. Advantageously, efficient light emission is provided and high quality material is provided through the formation of crystalline compound semiconductor epitaxial layers. Such layers enable the formation of high quality partially reflective layers, including DBR layers.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which:

FIG. 1E shows a cross-sectional view of the structures of FIGS. 1C and 1D bonded together to form a dual colour LED structure;

FIG. 1F shows a cross-sectional view of the dual colour LED structure of FIG. 1E with the handling wafer removed;

FIG. 2D shows a cross-sectional view of the structures of FIG. 2B and FIG. 2C bonded together to form a dual colour LED structure;

FIG. 2E shows a cross-sectional view of a processed version of the structure of FIG. 2D;

FIGS. 1A to 1L show steps of a method for making a dual colour light emitting structure with improved light emission properties, whereby the steps are illustrated by virtue of description with respect to cross sectional views through layers of the light emitting structure. Advantageously, the dual colour light emitting structure, in an example, is implemented into an array of dual colour light emitting structures, thereby forming a dual colour display. Such a display can be implemented by the cooperation of light emitting structures with controlling electrode arrays. The light emitting structure is formed from two independent light emitting diode (LED) structures and therefore provides a dual colour LED structure. In the prior art, single LED structures are typically arranged in order to optimise light emission through a primary light emitting surface area at a top or bottom of the LED structure. Where different wavelength colours of light are required, those known structures are typically arranged such that different colour LEDs are next to one another, providing separate light emitting surfaces of different colour wavelengths of light (where in arrays of LED structures, such light emitting surfaces may provide distinct pixels). In contrast, advantageously, the dual colour LED structure described here enables improved colour uniformity in arrays of LEDs by providing a common primary light emitting surface area and reducing the need for separate pixels of different colours, hence increasing resolution and reducing pixel pitch. Further, the dual colour LED provides increased brightness, since the sum of the brightness for each colour emitted by the dual colour LED is combined. Furthermore, improved colour emission is provided by reduction of photoluminescence in the dual LED structure. Beneficially, the method described herein is applicable to micro LED devices capable of realising RGB pixels that are suitable for both mass transfer processes for individual micro LEDs or for monolithic micro LED arrays.

Figure 1A:
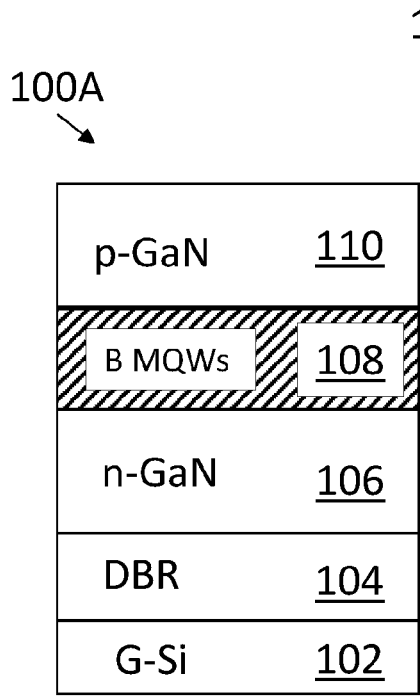
FIG. 1A shows a cross-sectional view of a blue light emitting LED structure.

FIG. 1A shows a light emitting structure 100A that is a blue light emitting LED structure. There is shown a stack of epitaxial compound semiconductor crystalline layers. The epitaxial compound semiconductor crystalline layers are provided by sequential growth of the layers on a substrate 102. Beneficially, such epitaxial compound semiconductor crystalline layers formed in this manner can be controlled with high precision to provide high quality material and efficient light emission upon the injection of carriers, from n-type and p-type regions, into a light emitting region.

In FIG. 1A there is shown a substrate 102 upon which there is grown a partially reflective layer 104. The substrate 102 is a growth silicon substrate. The partially reflective layer 104 is a distributed Bragg reflector (DBR). In an example the DBR is formed on an n-type semiconductor layer using the method described in Zhang et al., *ACS Photonics*, 2, 980 (2015). The partially reflective layer 104 is formed in a way that it reflects all wavelengths between 400 nm and 500 nm. Light of longer wavelengths, e.g., green light with a wavelength of 520 nm, transmits through the partially reflective layer.

The partially reflective layer 104 is formed from alternating epitaxial crystalline layers of different refractive indices. The refractive indices of the layers, and the thicknesses of the layers, are selected in order to provide a reflectivity response as a function of the wavelength of light incident at the partially reflective layer 104. Further, the porosity of the epitaxial crystalline layers forming the partially reflective layer 104 is controlled in order to provide the desired reflectivity response as a function of wavelength, since the porosity of the epitaxial crystalline layers is linked to their refractive index.

In an example, alternating high and low refractive index layers form the partially reflective layer 104, whereby the thickness of each of the high ($n_H$) and low ($n_L$) refractive index layers is chosen so that the product of the thickness and the index of refraction of the layer is $\lambda 0/4$, whereby $\lambda 0$ is the central wavelength of a high reflectivity response between +/−λe around λ0 in accordance with the following equation:

$$\lambda e = \lambda 0 \bigg/ \left[1 - \left(\frac{2}{\pi}\right)\sin^{-1}\left(\frac{n_H - n_L}{n_H + n_L}\right)\right]$$

Figure 6A:
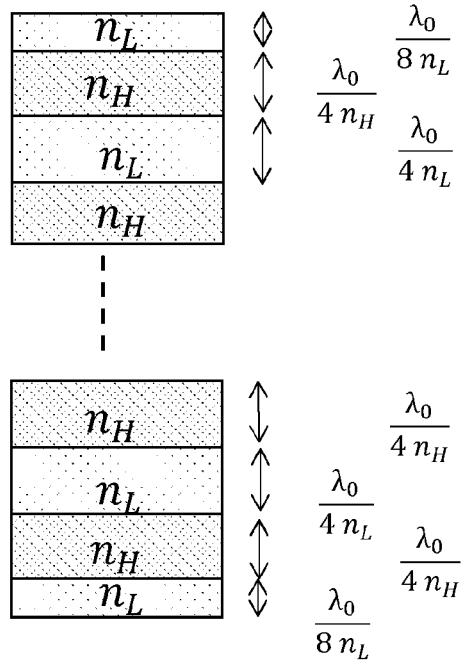
FIG. 6A shows an exemplary DBR structure.
Figure 6B:
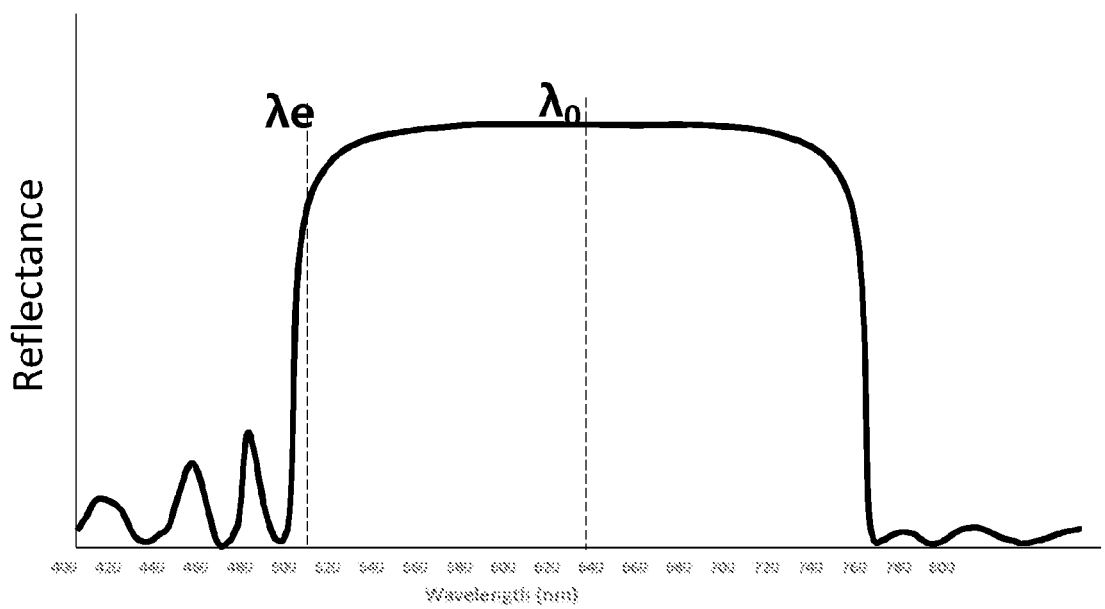
FIG. 6B shows an exemplary reflectivity response at normal incidence angle as a function of wavelength for the structure of FIG. 6A.

FIG. 6A illustrates a cross sectional view of an example of such alternating high and low refractive index layers 1600A forming a partially reflective layer, as well as an associated reflectivity response 1600B, as a function of wavelength. Alternating high and low refractive index layers 1600A start and terminate at the bottom and top of the structure with low refractive index layers that are half as thick ($\lambda 0/8$ instead of $\lambda 0/4$) as the other alternating layers in the structure 1600A, providing a Herpin-DBR, providing the reflectivity response at normal incidence angle seen at FIG. 6B.

Figure 7A:
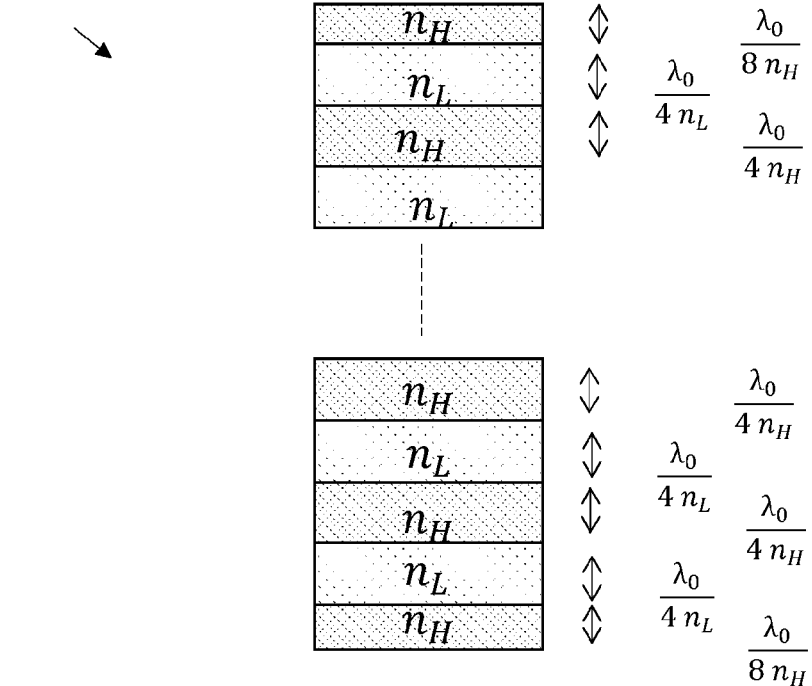
FIG. 7A shows an exemplary DBR structure.
Figure 7B:
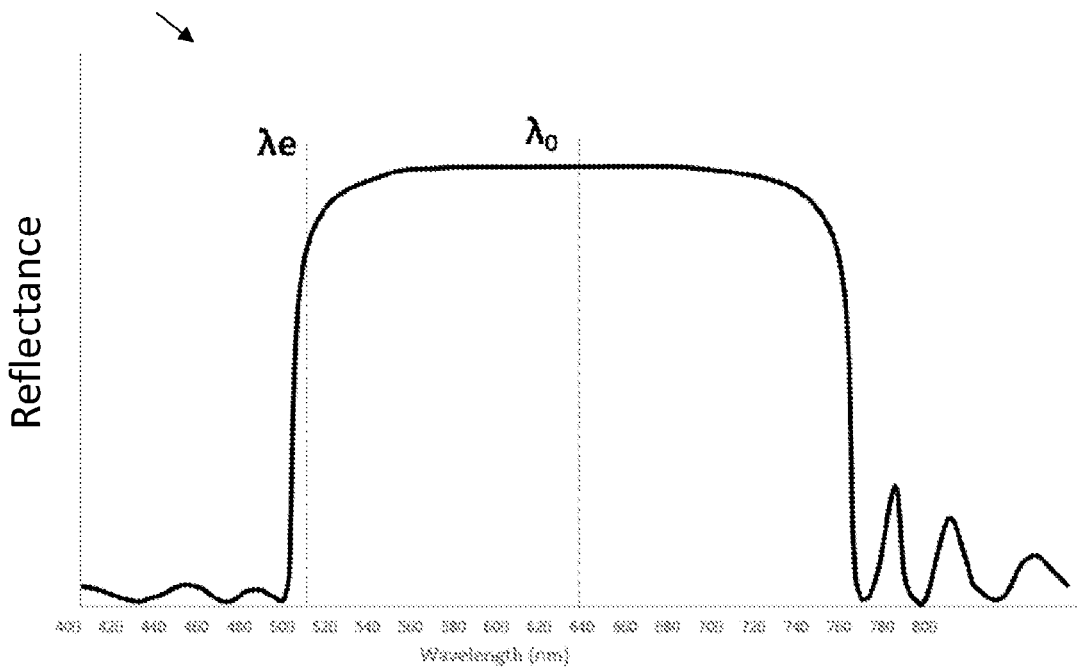
FIG. 7B shows an exemplary reflectivity response at normal incidence angle as a function of wavelength for the structure of FIG. 7A.

FIG. 7A illustrates an alternative alternating high and low refractive index layer structure 1700A forming a partially reflective layer, as well as an associated reflectivity response 1700B. Alternating high and low refractive index layers 1700A start and terminate at the bottom and top of the structure with high refractive index layers that are half as thick ($\lambda 0/8$ instead of $\lambda 0/4$) as the other alternating layers in the structure 1600A, providing a Herpin-DBR with the reflectivity response at normal incidence angle seen at FIG. 7B.

Figure 8A:
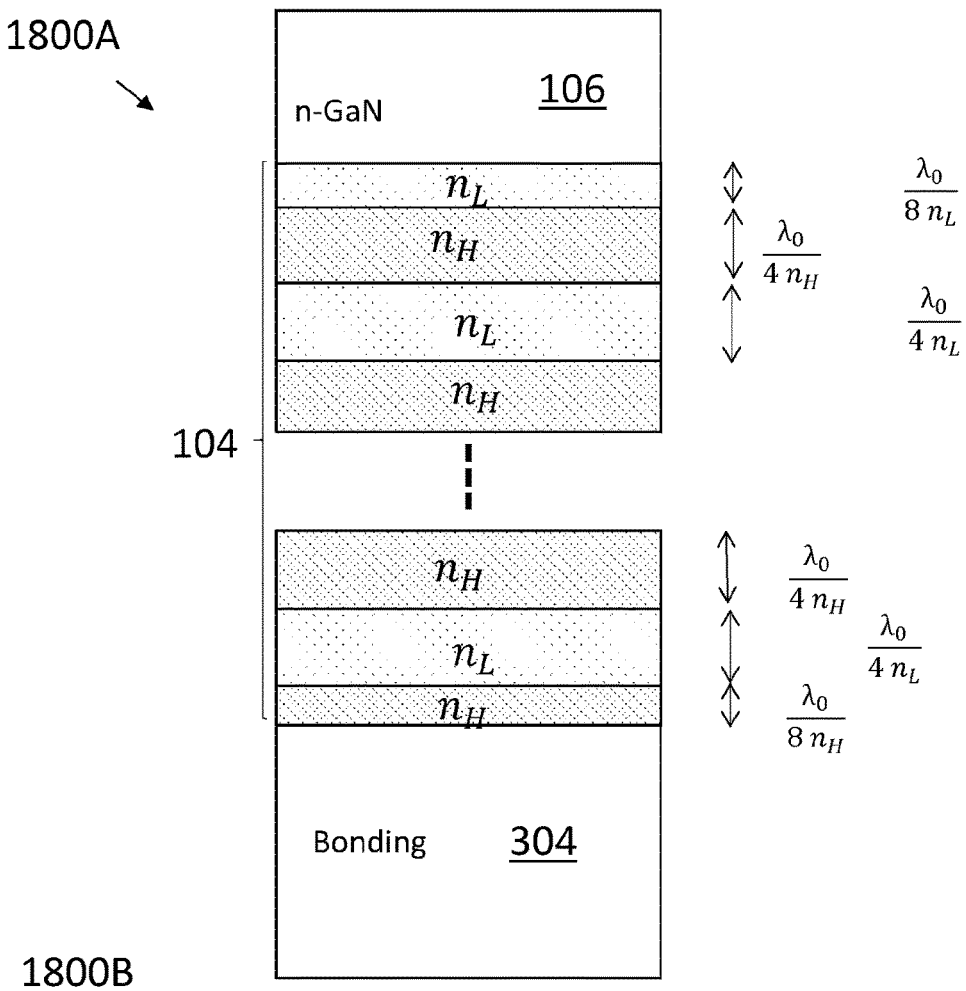
FIG. 8A shows an exemplary DBR structure associated to FIG. 1L.
Figure 8B:
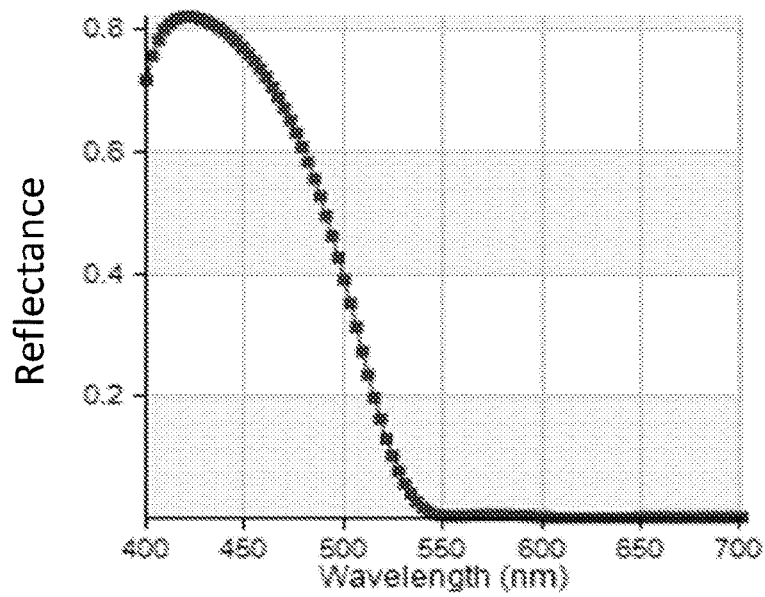
FIG. 8B shows an exemplary reflectivity response at normal incidence angle as a function of wavelength for the structure of FIG. 8A.

Whilst the specific structure arranged to provide the desired effect can be implemented in different ways, in an example, the partially reflective layer 104 has a structure 1800A as described with respect to FIG. 8A. The partially reflective layer 104 comprises alternating high and low refractive index layers. Where the structure is formed for a wavelength of light of $\lambda 0=430$ nm, a first layer has a thickness of 21.3 nm ($\lambda 0/8$ instead of $\lambda 0/4$) and is formed from Gallium Nitride that is not porous, the next layer is a porous Gallium Nitride layer with a porosity of 70% and thickness of 66 nm. The next layer is a Gallium Nitride layer that is not porous and is 42.6 nm thick. The next layer is another Gallium Nitride layer with a porosity of 70% and thickness of 66 nm. The next layer is another Gallium Nitride Layer that is not porous and is 42.6 nm thick. Three more pairs of alternating Gallium Nitride 66 nm thick with a porosity of 70% and non-porous 42.6 nm Gallium Nitride are formed. A final layer of 70% porous Gallium Nitride of 33 nm terminates the structure ($\lambda 0/8$ instead of $\lambda 0/4$). The structure described with respect to FIG. 8A provides a reflectance as a function of wavelength as shown at the reflectivity response at normal incidence angle 1800B of FIG. 8B.

Whilst the partially reflective layer 104 is formed in the above manner, alternatively, or additionally the structure and/or layers of the partially reflective layer 104 are formed from different layers and materials, with different porosities and thicknesses that provide the required reflectivity response. For example, it is known that the porosity of a material can be changed in order to change its refractive index (e.g., see M. M. Braun, L. Pilon, "*Effective optical properties of non-absorbing nanoporous thin films*", *This Solid Films* 496 (2006) 505-514). For example, the refractive index for porous Gallium Nitride may vary as a function of the percentage porosity in accordance with the following equation:

$$n_p = \sqrt{(1-p) \cdot n_{GaN}^2 + p},$$

where p is the percentage porosity and n is the refractive index. In an example, for a wavelength of 450 nm, the refractive index of porous Gallium Nitride is 2.44 at 0% porosity, 2.34 at 10% porosity, 2.23 at 20% porosity, 2.12 at 30% porosity, 2.00 at 40% porosity, 1.87 at 50% porosity, 1.73 at 60% porosity, 1.58 at 70% porosity, 1.41 at 80% porosity and 1.22 at 90% porosity. Therefore, advantageously, DBRs with the properties required to provide the reflectivity profiles herein are formable using alternating layer of GaN with different porosities, whilst maintaining the crystalline structure to form light emitting structures of high quality material. Alternatively, or additionally, the concept is applicable to different materials.

Advantageously, the partially reflective layer 104 is formed as part of a continuous process that forms the light emitting structure 100A, thereby to provide higher quality material and reduce the processing burden.

Whilst the partially reflective layer 104 is a DBR, in further examples the partially reflective layer 104 is additionally, or alternatively formed using different methods whilst maintaining the functionality of enabling reflection of some wavelengths of light and transmission of different wavelengths of light.

On top of the partially reflective layer 104 there is an n-type region 106. The n-type region is n-doped Gallium Nitride (n-GaN). On top of the n-type region 106 there is a light emitting region 108. The light emitting region 108 is a blue light emitting region 108. On top of the blue light emitting region 108, there is grown a p-type region 110. The p-type region is p-doped Gallium Nitride (p-GaN). The light emitting structure 100A is based on a typical blue LED structure. In further examples, alternative blue light emitting structures are used, with additional or alternative layers.

Whilst the n-type region 106 is n-doped GaN, in further examples, additionally, or alternatively, the n-type region 106 comprises different materials. Whilst the p-type region 110 is p-doped GaN, in further examples, additionally, or alternatively, the p-type region 110 comprises different materials.

Whilst the growth of epitaxial GaN-based materials on a silicon growth substrate 102 is shown, in further examples, additional or alternative intervening layers are used in order to account for a lattice mismatch between the silicon substrate 102 and the subsequently grown layers, such as the partially reflective layer 104, the n-type region 106, the light emitting region 108 and the p-type region 110. In an example, the growth substrate 102 comprises silicon with an Aluminium Nitride (AlN) buffer layer.

Figure 1B:
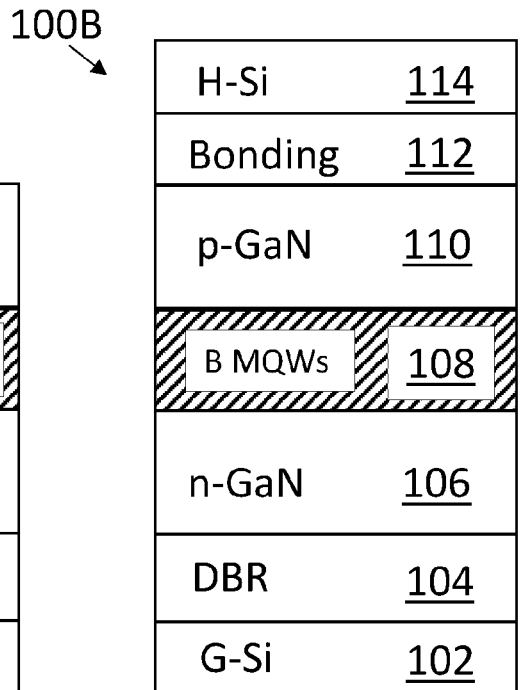
FIG. 1B shows a cross-sectional view of the LED of FIG. 1A bonded to a handling wafer.

Once the light emitting structure 100A of FIG. 1A has been provided, the light emitting structure 100A is bonded to a handling device, which is a silicon handling wafer 114, using a bonding layer 112. This is shown in FIG. 1B. The handling wafer 114 is a silicon handling wafer 114. The handling wafer 114 is bonded to the p-type region of the light emitting structure 100A of FIG. 1A using a bonding layer 112 of optical transparent adhesive (OCA).

The bonding layer 112, which is OCA advantageously has excellent transparency and insulation properties. Whilst the bonding layer 112 is OCA in the example of FIG. 1B, in further examples, additionally, or alternatively, the bonding layer 112 is formed using different means, including adhesive and mechanical means.

Figure 1C:
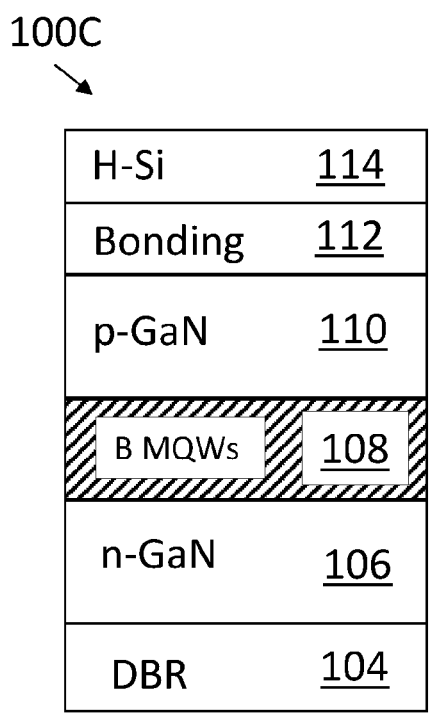
FIG. 1C shows a cross-sectional view of a processed version of the structure of FIG. 1B.

Once the handling wafer 114 has been bonded using bonding layer 112 to the light emitting structure 100A, the substrate 102 of the light emitting structure 100A, 100B is removed. This is shown in FIG. 1C, where there is a light emitting structure 100C that is a processed version of the light emitting structure 100A, 100B shown in FIGS. 1A and 1B. The light emitting structure 100B of FIG. 1B is processed to provide the light emitting structure 100C of FIG. 1C by removal of the substrate 102. Removal of the substrate 102, which is a growth silicon wafer, is performed using a wet etch. In an example, the wet etch uses KOH solution, hydrofluoric acid and nitric acid and BOE. In further examples, additional or alternative methods are used to remove the substrate 102. Additionally, or alternatively, dry etching techniques are used to remove additional layers, such as buffer layers that have been formed between the substrate 102 and the remainder of the light emitting structure.

Figure 1D:
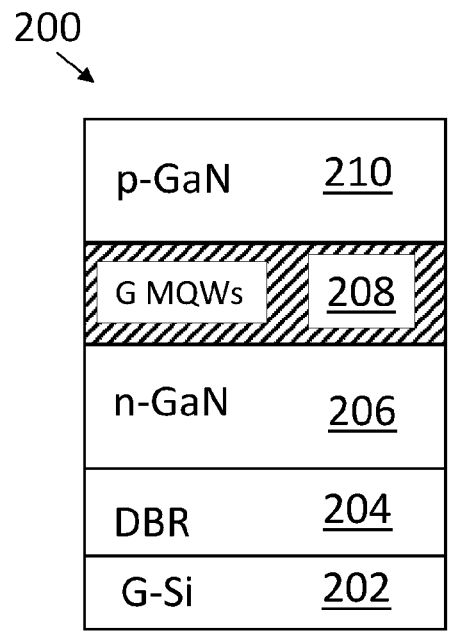
FIG. 1D shows a cross-sectional view of a green light emitting LED structure.

In addition to the provision of blue light emitting LED structure 100A, there is provided with a green light emitting structure 200, as shown at FIG. 1D. FIG. 1D shows a typical green light emitting LED structure 200, with a substrate 202 upon which there is a partially reflective layer 204, upon which there is an n-type region 206. Upon the n-type region 206 there is shown a green light emitting region 208. On top of the light emitting region 208 there is shown a p-type region 210. The green light emitting structure 200 of FIG. 1D is provided in an analogous manner to the blue light emitting structure 100A of FIG. 1A.

In FIG. 1D there is shown a substrate 202 upon which there is grown a partially reflective layer 204. The substrate 202 is a growth silicon substrate. The partially reflective layer 204 is a distributed Bragg reflector (DBR). In an example the DBR is formed on an n-type semiconductor layer using the method described in Zhang et al., *ACS Photonics*, 2, 980 (2015). The partially reflective layer 204 is formed in a way that it reflects all wavelengths between 400 nm and 600 nm. Light of longer wavelengths, e.g., light with a wavelength of 605 nm, transmits through the partially reflective layer.

The partially reflective layer 204 is formed from alternating epitaxial crystalline layers of different refractive indices. The refractive indices of the layers, and the thicknesses of the layers, are selected in order to provide a reflectivity response as a function of the wavelength of light incident at the partially reflective layer 204. Further, the porosity of the epitaxial crystalline layers forming the partially reflective layer 204 is controlled in order to provide the desired reflectivity response as a function of wavelength.

In an example, alternating high and low refractive index layers form the partially reflective layer 204, whereby the thickness of each of the high ($n_H$) and low ($n_L$) refractive index layers is chosen so that the product of the thickness and the index of refraction of the layer is $\lambda 0/4$, whereby $\lambda 0$ is the central wavelength of a high reflectivity response between $+/-\lambda e$ around $\lambda 0$ in accordance with the following equation:

$$\lambda e = \lambda 0 \bigg/ \left[1 - \left(\frac{2}{\pi}\right)\sin^{-1}\left(\frac{n_H - n_L}{n_H + n_L}\right)\right]$$

As described above, exemplary structures and response based on the above equation are shown at FIGS. 6A, 6B, 7A and 7B.

Figure 9A:
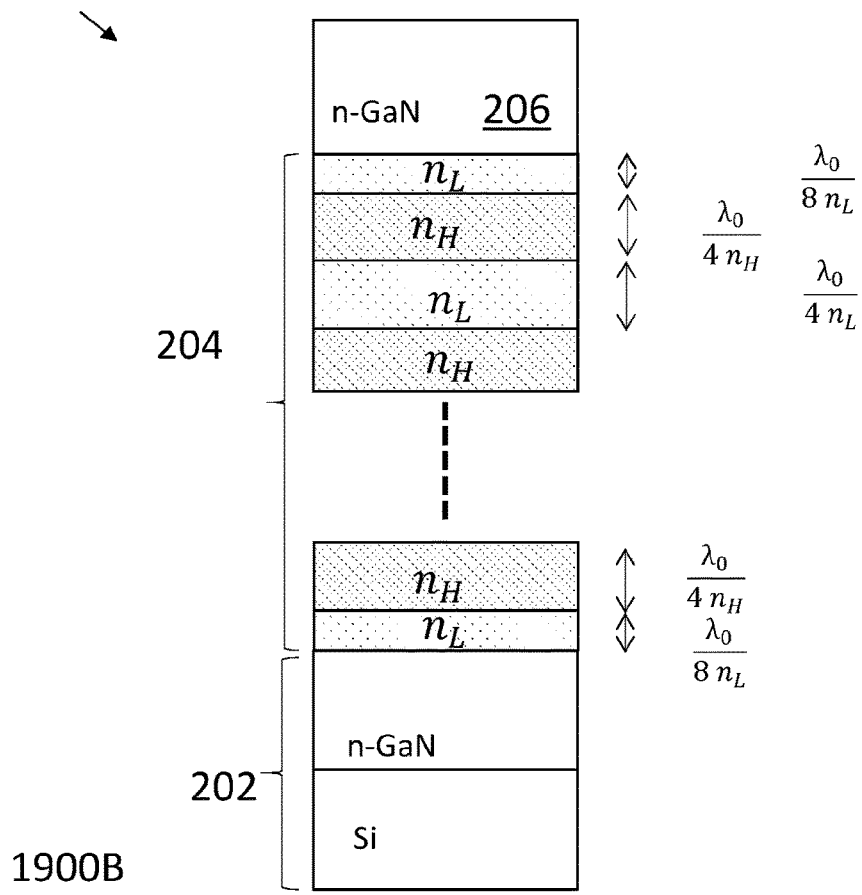
FIG. 9A shows an exemplary DBR structure associated to FIG. 1L.
Figure 9B:
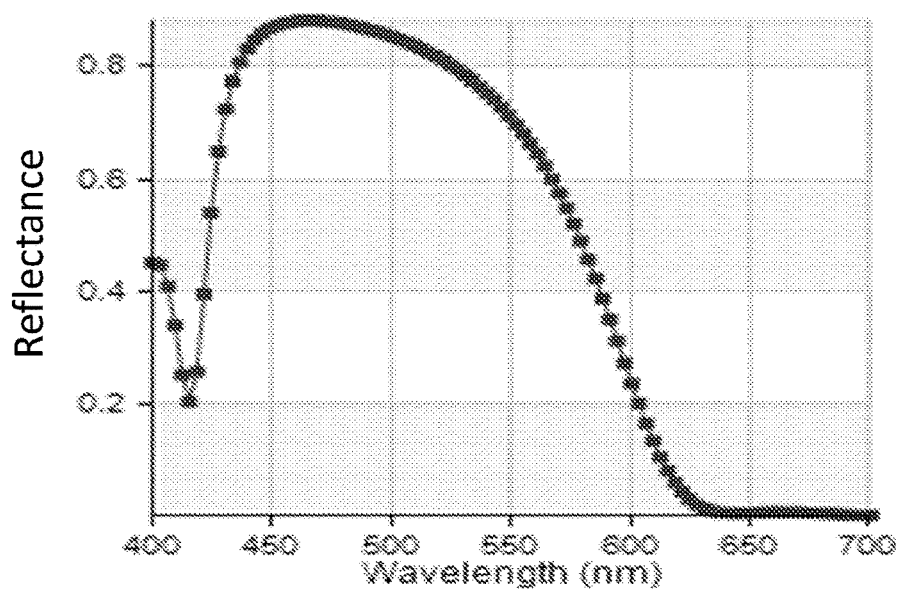
FIG. 9B shows an exemplary reflectivity response at normal incidence angle as a function of wavelength for the structure of FIG. 9A.

Whilst the specific structure arranged to provide the desired effect can be implemented in different ways, in an example, the partially reflective layer 204 has a structure 1900A as described with respect to FIG. 9A. The partially reflective layer 304 comprises alternating high and low refractive index layers. Where the structure is formed for a wavelength of light of λ0=500 nm, a first layer has a thickness of 44.3 nm (λ0/8 instead of λ0/4) and is porous Gallium Nitride with a porosity of 80%. The next layer has a thickness of 53 nm and is formed from Gallium Nitride that is not porous, the next layer is a porous Gallium Nitride layer with a porosity of 80% and thickness of 88.7 nm. The next layer is a Gallium Nitride layer that is not porous and is 53 nm thick. The next layer is another Gallium Nitride layer with a porosity of 80% and thickness of 88.7 nm. The next layer is another Gallium Nitride Layer that is not porous and is 53 nm thick. Three more pairs of alternating Gallium Nitride 88.7 nm thick with a porosity of 80% and non-porous 53 nm Gallium Nitride are formed. A final layer of 80% porous Gallium Nitride of 44.3 nm terminates the structure (λ0/8 instead of λ0/4). The structure described with respect to FIG. 9A provides a reflectance as a function of wavelength as shown at the reflectivity response at normal incidence angle 1900B of FIG. 9B.

Whilst the partially reflective layer 204 is formed in the above manner, alternatively, or additionally the structure and/or layers of the partially reflective layer 204 are formed from different layers and materials, with different porosities and thicknesses that provide the required reflectivity response.

Advantageously, the partially reflective layer 204 is formed as part of a continuous process that forms the light emitting structure 200, thereby to provide higher quality material and reduce the processing burden.

Whilst the partially reflective layer 204 is a DBR, in further examples the partially reflective layer 204 is additionally, or alternatively formed using different methods whilst maintaining the functionality of enabling reflection of some wavelengths of light and transmission of different wavelengths of light.

On top of the partially reflective layer 204 there is an n-type region 206. The n-type region is n-doped Gallium Nitride (n-GaN). On top of the n-type region 206 there is a light emitting region 208. The light emitting region 208 is a green light emitting region 208. On top of the green light emitting region 208, there is grown a p-type region 210. The p-type region is p-doped Gallium Nitride (p-GaN). The light emitting structure 200 is based on a typical green LED structure. In further examples, alternative green LED structures are used, with additional or alternative layers.

Whilst the n-type region 206 is n-doped GaN, in further examples, additionally, or alternatively, the n-type region 206 comprises different materials. Whilst the p-type region 210 is p-doped GaN, in further examples, additionally, or alternatively, the p-type region 210 comprises different materials.

Whilst the growth of epitaxial GaN-based materials on a silicon growth substrate 202 is shown, in further examples, additional or alternative intervening layers are used in order to account for a lattice mismatch between the silicon substrate 202 and the subsequently grown layers, such as the partially reflective layer 204, the n-type region 206, the light emitting region 208 and the p-type region 210. In an example, the growth substrate 102 comprises silicon with an Aluminium Nitride (AlN) buffer layer.

The light emitting structures 100A, 100B, 100C shown at FIGS. 1A, 1B and 1C, respectively, and the light emitting structure 200 shown at FIG. 1D, differ from conventional LED structures at least insofar as they have a partially reflective layer 104, 204 positioned at least partially in between the substrate and n-type regions of the structures 100A, 100B, 100C, 200. Advantageously, incorporation of a partially reflective layer into the formation of these structures results in the partially reflective layer being positioned between different light emitting regions when the structures are bonded together, whilst enabling independent formation, and hence optimisation, of the different structures (e.g., optimised growth of a blue LED structure and optimised growth of a green LED structure).

Once the blue light emitting structure 100C and the green light emitting structure 200 have been provided, they are bonded together, however, prior to bonding the structures 100C, 200 together, a transparent conductive layer 302 is deposited on the blue light emitting structure 100C. The transparent conductive layer 302 is an Indium Tin Oxide (ITO) layer. This is shown at FIG. 1E. Advantageously, the formation of this layer prior to bonding enables the elegant and efficient incorporation of the layer and its physical properties into the bonded structure.

Whilst the transparent conductive layer 302 is an ITO layer, in further examples, additional or alternative material is used in order to provide a transparent conductive layer 302.

FIG. 1E shows a dual colour LED structure 300A, whereby the light emitting structure 1A processed to provide the blue light emitting structure 100C is bonded to the green light emitting structure 200 such that the partially reflective layer 104 of the process light emitting structure 100C is bonded to the transparent conductive layer 302 deposited on the p-type region 210 of the light emitting structure 200 (therefore enabling improved carrier injection into the p-type region 210 at a later stage). The blue light emitting structure 100C is bonded to the green light emitting structure 200 using a bonding layer 304 that is an OCA adhesive.

Whilst the bonding layer 304 is formed from OCA. In further examples, additional or alternative materials are used to form the bonding layer 304.

Once the dual colour LED structure 200 of FIG. 1E has been provided, it is processed to provide the structure 300A shown at FIG. 1F.

FIG. 1F shows a processed dual colour light emitting structure 300B of the dual colour LED structure 300A of FIG. 1E, whereby the handling wafer 114 and the bonding layer 112 have been removed. Once the handling wafer 114 and the bonding layer 112 have been removed, as shown at FIG. 1F, a transparent conductive layer 306 is formed on the p-type region 110 of the dual light emitting structure 300B (and therefore provide improved carrier injection in the p-type region 110 at a later stage). Advantageously, following the removal of the handling wafer 114, the growth substrate 202 remains and can be used to move the structure 300B without deleterious implications.

Figures 1G, 1H:
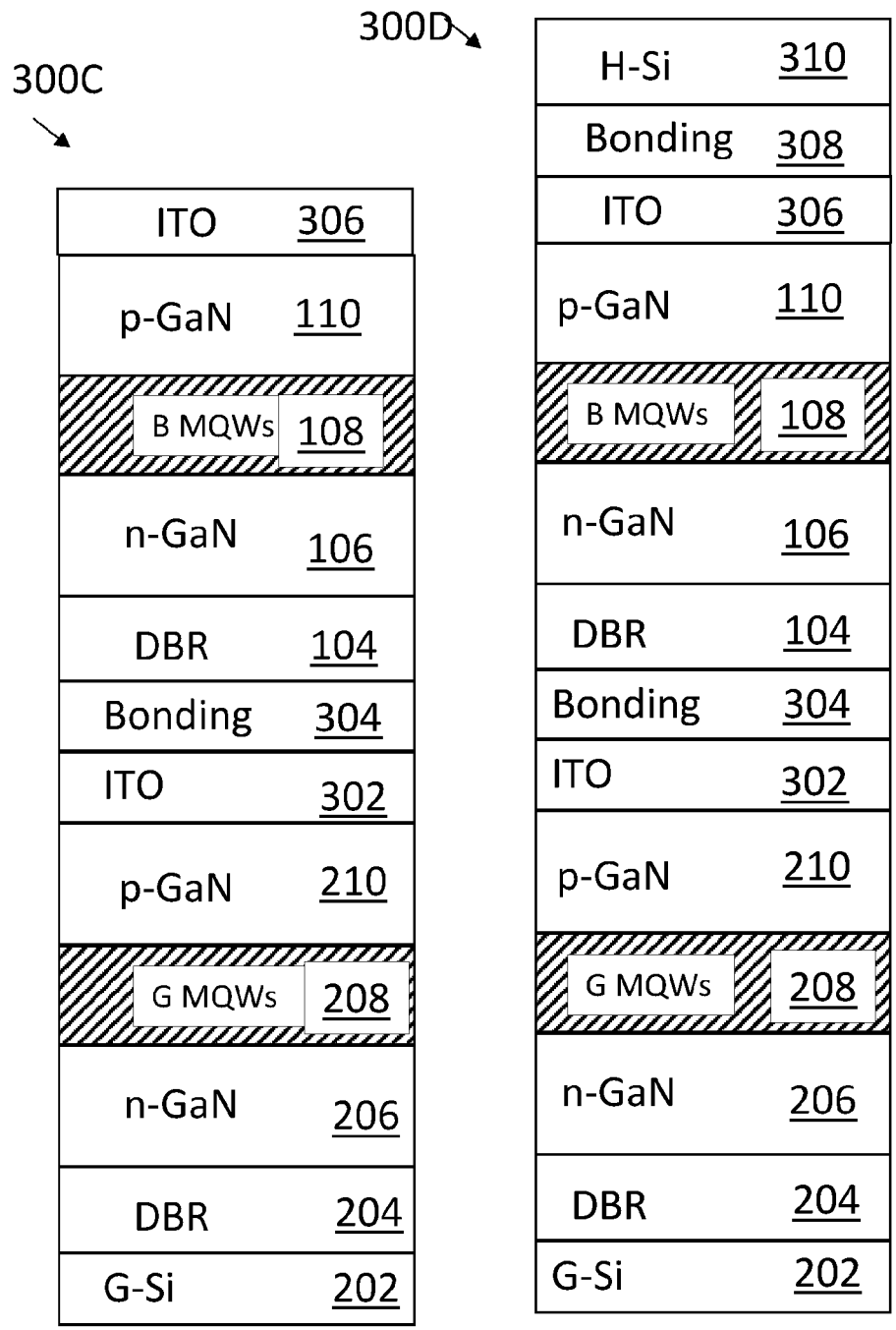
FIG. 1G shows a cross-sectional view of a processed version of the dual colour LED structure of FIG. 1F.
FIG. 1H shows a cross-sectional view of a processed version of the dual colour LED structure of FIG. 1G.

FIG. 1G shows the dual light emitting structure 300B of FIG. 1F that has been processed in order to provide a transparent conductive layer 306 on top of the p-type region 110. The transparent conductive layer 306 is ITO deposited on the p-type region 110. In further examples, the transparent conductive layer 306 is formed from additional or alternative material.

The dual colour LED structure 300C of FIG. 1G is then processed such that a handling wafer 310 is bonded using bonding layer 308 to the transparent conductive layer 306 of the dual colour light emitting structure 300C to provide the structure 300D shown at FIG. 1H. The handling device 310 is a silicon wafer 310 bonded to the transparent conductive layer 306 using a bonding layer 308 formed of OCA. In further examples, additional or alternative materials are used in the bonding layer 308. In yet further examples, additional or alternative material is used in the handling wafer 310.

Advantageously, once the dual colour LED structure 300D of FIG. 1H has been provided, the growth substrate 202 is removed. Removal of the substrate 202, which is a growth silicon wafer, is performed using a wet etch. In an example, the wet etch uses KOH solution, hydrofluoric acid and nitric acid and BOE. In further examples, additional or alternative methods are used to remove the substrate 202. Additionally, or alternatively, dry etching techniques are used to remove additional layers, such as buffer layers that have been formed between the substrate 202 and the remainder of the light emitting structure.

Once the substrate 202 has been removed, electrical contacts are formed in a structure. The formation of electrical enables carrier injection into each of the light emitting regions 108, 208. This is achieved by providing an electrical contact pair to the n-type region 106 and p-type region 110 for the blue light emitting region 108 and by providing an electrical contact pair to the n-type region 206 and the p-type region 210 for the green light emitting region 208.

Figure 1I:
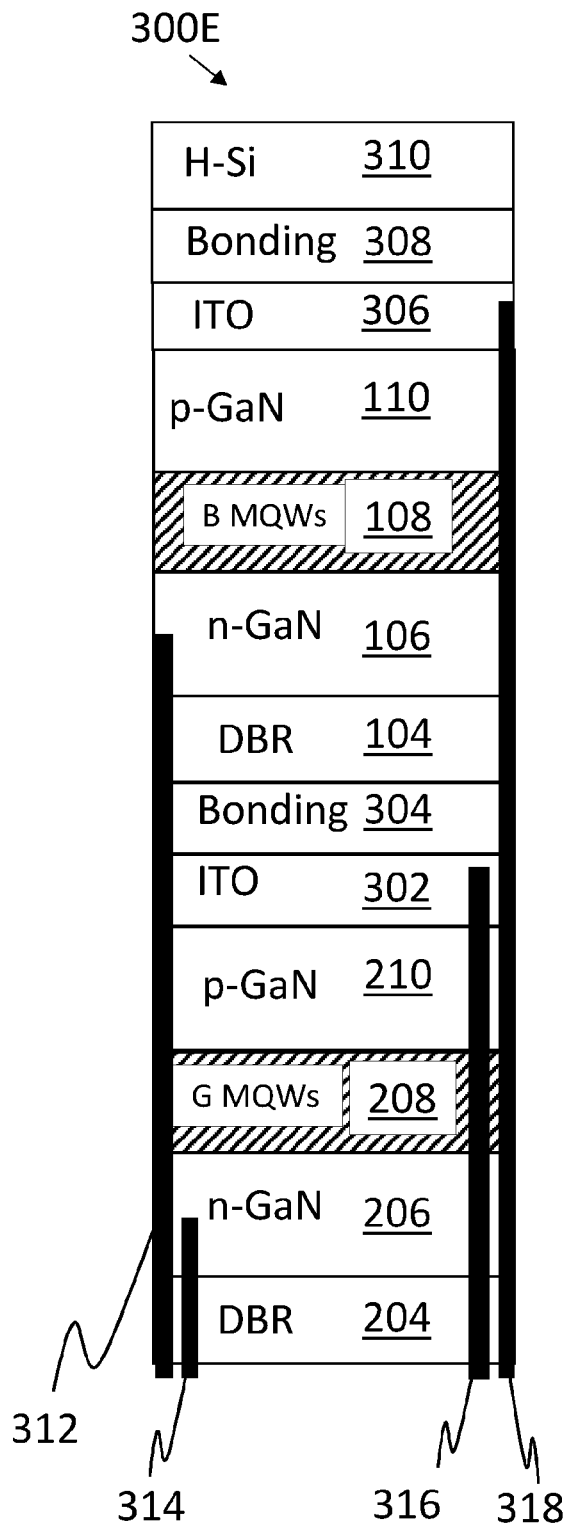
FIG. 1I shows a cross-sectional view of a processed version of the dual colour LED structure of FIG. 1H.

This is shown at FIG. 1I, where dual colour light emitting structure 300E is shown to have vias 312, 314, 316, 318 formed selectively through the structure 300E. The vias 312, 314, 316, 318 are formed by selectively etching through the dual colour light emitting structure 300E. This is achieved using photo-lithographical techniques based on patterning of resist layers deposited on the dual colour light emitting structure 300E. In further examples, alternative or additional techniques are used to form the vias 312, 314, 316, 318.

The vias 312, 314, 316, 318 are formed such that they penetrate the light emitting structure 300E to provide electrical contact to enable carrier injection into the light emitting regions 108, 208.

Via 312 is formed to pass through the partially reflective layer 204, the n-type region 206, the light emitting region 208, the p-type region 210, the transparent conductive layer 302, the bonding layer 304 and the partially reflective layer 104 to enable the formation of an electrical contact with the n-type region 106. Accordingly, the via 312 provides a passage to the n-type region 106.

Similarly, there is shown a via 314 passing through the partially reflective region, which is a partially reflective layer 204, to the n-type region 206. The vias 312 and 314 to the n-type regions provide passages which to form contacts with the n-type regions associated with their respective light emitting regions 108, 208.

Via 316 is shown to be formed to pass through partially reflective layer 204, n-type region 206, light emitting region 208 and p-type region 210 into transparent conductive layer 302, to enable the formation of an electrical contact with transparent conductive layer 302. The transparent conductive layer 302 is in electrical contact with the p-type region 210 and therefore enables distribution of carriers across the breadth of the light emitting region 208, in view of the relatively lower electrical conductivity of the p-type region. In further examples, the transparent conductive layer 302 is not required to serve this function and the via 316 is instead formed to provide electrical connection with the p-type region 210 directly.

Via 318 is shown to be formed to pass through partially reflective layer 204, n-type region 206, light emitting region 208, p-type region 210, transparent conductive layer 302, bonding layer 304, partially reflective layer 104, n-type region 106, light emitting region 108 and p-type region 110 to enable formation of an electrical connection with the transparent conductive layer 306. The transparent conductive layer 306 is in electrical contact with the p-type region 110 and therefore enables distribution of carriers across the breadth of the light emitting region 108, in view of the relatively lower electrical conductivity of the p-type region. In further examples, the transparent conductive layer 306 is not required to serve this function and the via 318 is instead formed to provide electrical connection with the p-type region 110 directly.

Therefore, the vias 316, 318 provide routes to enable the formation of electrical connections to the p-type regions associated with each of the light emitting regions 208 to 108, respectively.

Accordingly, one pair of vias 314, 316 provide the means to form an electrode pair in respect of the green light emitting region 208. The other pair of vias 312, 318 provide the means to form an electrode pair in respect of the blue light emitting region 108. In order to form contacts with the respective regions of the blue light emitting region 108 and green light emitting region 208, an insulator layer may be formed on the inner wall of the vias 312, 314, 316, 318. The transparent conductive layer 302 is in electrical contact with the p-type region 210 and therefore enables distribution of carriers across the breadth of the light emitting region 208, in view of the relatively lower electrical conductivity of the p-type region. In further examples, the transparent conductive layer 302 is not required to serve this function and the via 316 is instead formed to provide electrical connection with the p-type region 210 directly.

Once the vias 312, 314, 316, 318 have been insulated such that electrical connection to the desired region can be established, a conductive material is formed in each of the vias 312, 314, 316, 318. The conductive material is metal that is plated in the insulated vias 312, 314, 316, 318. In further examples, the conductive material is additional or alternative material and, in further examples, the conductive material is deposited using other techniques, thereby to provide electrical contact to the regions in which the vias 312, 314, 316, 318 contact.

In order to enable controlled electrical connection in order to inject carriers into the light emitting regions 108, 208, the dual colour light emitting structure 300E of FIG. 1I is processed further.

Figure 1J:
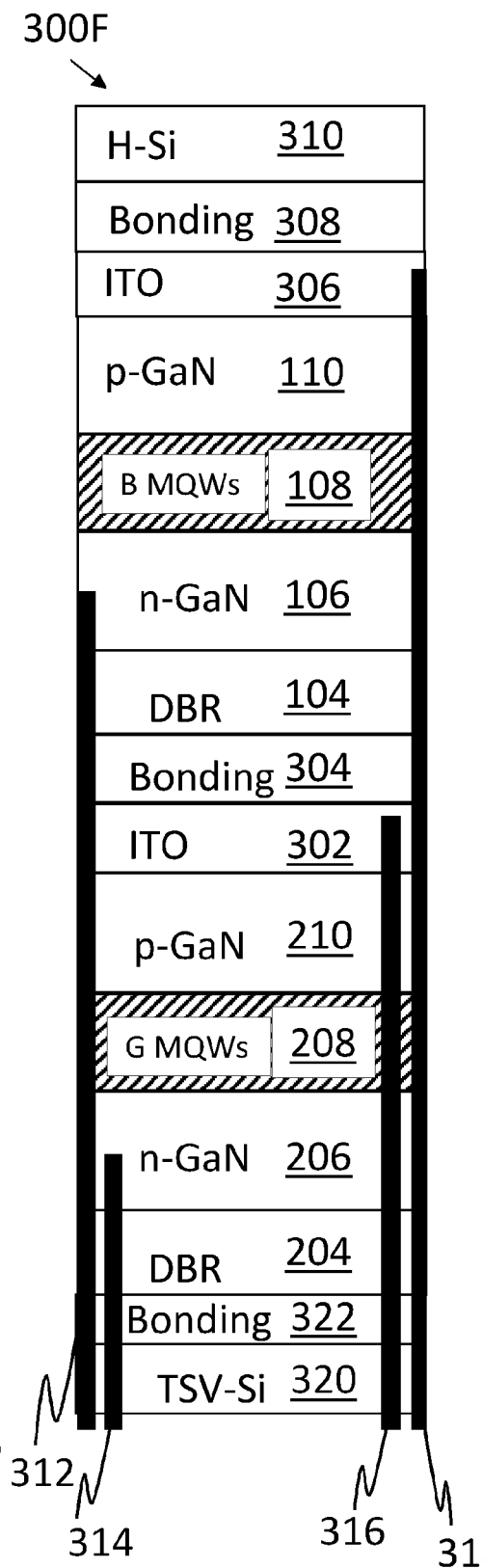
FIG. 1J shows a cross-sectional view of a processed version of the dual colour LED structure of FIG. 1J.

FIG. 1J shows a processed version of the LED structure 300E of FIG. 1I. At FIG. 1J there is shown a dual colour LED structure 300F with an additional through silicon via bonded and aligned to make connection with the electrodes that are formed in the vias 312, 314, 316, 318.

The through silicon via 320 is bonded to the partially reflective layer 204 of the structure 300F via bonding layer 322. Once electrical contacts have been made to the light emitting structures, the handling wafer 310 and bonding layer 308 may be removed from the structure 300F.

Figure 1K:
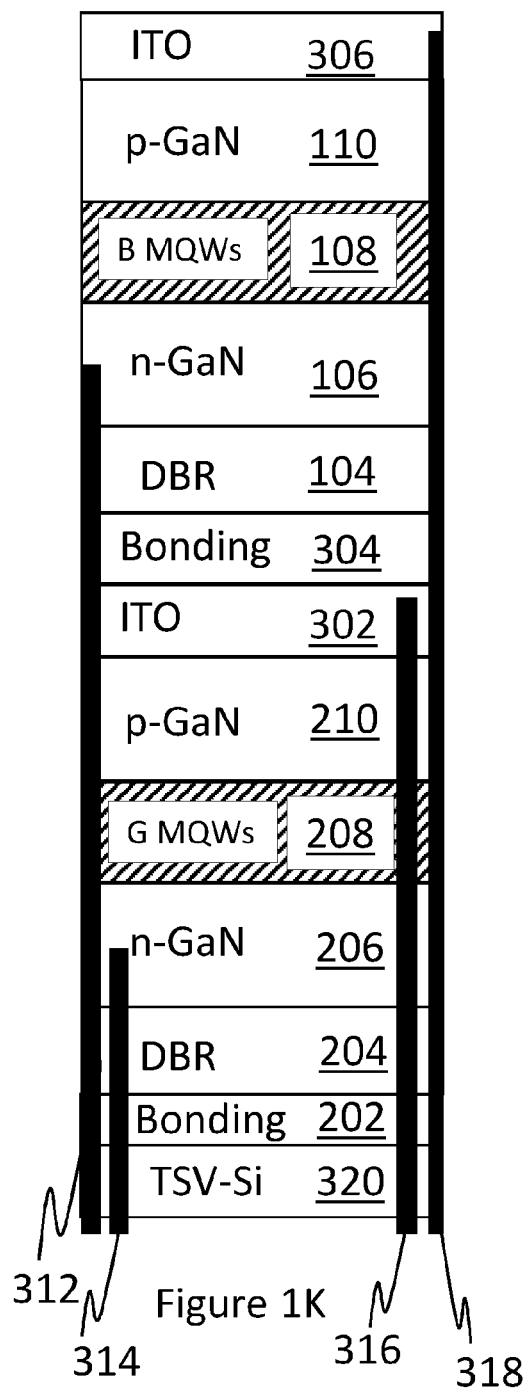
FIG. 1K shows a cross-sectional view of a processed version of the dual colour LED structure of FIG. 1J.

Removal of the handling wafer 310 and bonding layer 308 provides a dual colour LED structure 300G as shown at FIG. 1K. The light emitting structure of FIG. 1K is configured to emit light through the conductive transparent layer 306.

Advantageously, the partially reflective layer 204 is configured to substantially reflect green light. Further, the partially reflective layer 104 is configured to allow green light substantially to pass through it and to be emitted via the transparent conductive layer 306, whilst preventing blue light from passing from the blue light emitting region 108 to the green light emitting region 208 by virtue of substantially reflecting blue light.

Beneficially, blue light that would otherwise excite emission in the green light emitting region 208 is prevented from doing so. Beneficially, there is improved light emission through the top of the structure via transparent conductive layer 306.

Figure 1L:
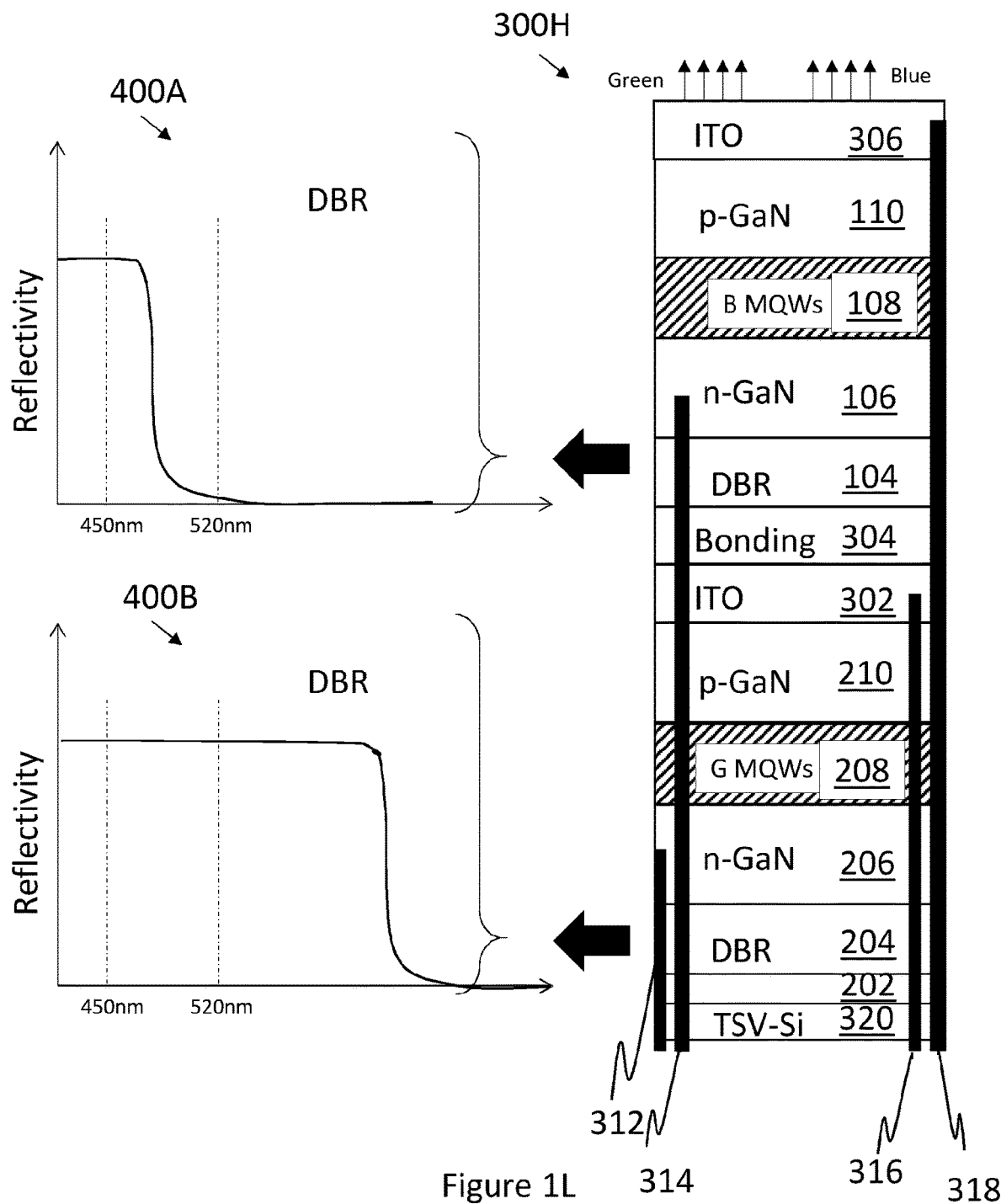
FIG. 1L shows a cross-sectional view of a dual colour LED structure.

The reflectivity properties, as a function of wavelength of light, of the partially reflective layers 204, 104 are shown at FIG. 1L. The reflectivity response of the partially reflective layer 104 is such that blue light is reflected and green light is allowed to pass through it, this reflectivity response is shown at 400A, by virtue of a reflectivity step change between 450 nm and 520 nm wavelengths of light.

The reflectivity response 400B, as a function of wavelength of light, of the partially reflective layer 204 is shown at FIG. 1L. Accordingly, blue and green wavelengths are shown to be reflected. The step change of reflectivity does not occur until substantially after 520 nm.

Whilst the partially reflective layers 104, 204 are configured to enable reflection and transmission of blue and green primary peak wavelengths in order to optimise light extracted through the top of the dual light emitting structure 300H, in further examples, alternative or additional light emitting regions 108, 208 and partially reflective layers 104, 204 are used in order to optimise the light production of different wavelengths of light.

The light emitting structure 100A of FIG. 1A and the light emitting structure 200 of FIG. 1D are formed using epitaxial compound semiconductor growth techniques such as metal-organic chemical vapour deposition (MOCVD) and molecular beam epitaxy (MBE). Additionally, or alternatively, the light emitting structures 100A and 200 are formed using any appropriate technique. Whilst the light emitting structures 100A and 200 are LED structures, in further examples, additionally, or alternatively, the light emitting structures 100A, 200 are different light emitting structures benefitting from the use of a partially reflective layer to prevent light emission from the first light emitting region passing through the whole light emitting structure.

The growth of the epitaxial crystalline compound semiconductor layers described above is done using growth/deposition on silicon wafers that are used as growth substrates 102, 202. Alternatively, or additionally, other wafers are used, such as sapphire wafers or freestanding Gallium Nitride (GaN) wafers, for example.

Whilst certain epitaxial crystalline compound semiconductor layers are shown in FIGS. 1A to 1L, the skilled person understands that alternative, or additional, layers are used in further examples. Further, in some examples, some of the epitaxial crystalline compound semiconductor layers are removed whilst maintaining the essence of the concepts described herein.

The light emitting structures described with respect to FIGS. 1A to 1L are formed from nitride-based materials. In particular, the epitaxial crystalline compound semiconductor layers are Gallium Nitride (GaN) based materials. Whilst the structures described in relation to FIGS. 1A to 1L relate to Nitride-based semiconductor compound materials, the skilled person understands that the concepts described herein are applicable to other materials, in particular to other semiconductor materials, for example other III-V compound semiconductor materials, or II-VI compound semiconductor materials.

The light emitting regions 108, 208 are formed to include multiple quantum wells (MQWs). The blue light emitting region 108 includes MQWs that are configured to emit light with a primary peak wavelength that is blue, when carriers radiatively combine in the MQWs. The MQWs are formed from Indium Gallium Nitride (InGaN) that is epitaxially grown between GaN-based layers with the composition of the individual quantum wells being tailored to provide the desired wavelength of light that can be emitted from them. Whilst MQWs are described in the light emitting region 108, alternatively a single quantum well (SQW) layer is used. In further examples the light emitting region 108 comprises quantum dots (QDs) that are configured to emit light when carriers radiatively combine in the QDs. Whilst the primary peak wavelength of light emitted from the light emitting region 108 described with reference to FIG. 1A is configured to be blue, in further examples, the light emitting region 108 is additionally, or alternatively, configured to emit light with a different primary peak wavelength.

The green light emitting region 208 includes MQWs that are configured to emit light with a primary peak wavelength that is green, when carriers radiatively combine in the MQWs. The MQWs are formed from Indium Gallium Nitride (InGaN) that is epitaxially grown between GaN-based layers with the composition of the individual quantum wells being tailored to provide the desired wavelength of light that can be emitted from them. Whilst MQWs are described in the light emitting region 208, alternatively a single quantum well (SQW) layer is used. In further examples the light emitting region 208 comprises quantum dots (QDs) that are configured to emit light when carriers radiatively combine in the QDs. Whilst the primary peak wavelength of light emitted from the light emitting region 208 described with reference to FIG. 1D is configured to be green, in further examples, the light emitting region 108 is additionally, or alternatively, configured to emit light with a different primary peak wavelength.

Further, the skilled person understands that the provision of the dual light emitting LED structure in the manner described results in the efficient and high quality generation of material with reduced processing steps, by incorporating layers in the structure at either in the process of forming the individual light emitting structures, or in the processing steps involved in bring those individual light emitting structures together and processing the resultant structure. However, the skilled person further understands that in further examples, additional or alternative steps are used to form the structure and the order of the steps is chosen to provide different or additional benefits.

FIGS. 1A to 1L are used to describe a dual light emitting LED structure. However, the skilled person understands that in further examples, further light emitting regions are incorporated in order to provide structures that emit more than two primary peak wavelengths of light. As described above, RGB LED arrays use red, green and blue LEDs to provide colour emission that is implemented into colour arrays/displays and therefore a multicolour light emitting structure that emits red, green and blue light through a common light emitting surface area that effectively forms a RGB LED pixel is beneficial. Advantageously, the multicolour light emitting structure, in an example, is implemented into an array of multicolour light emitting structures, thereby forming a multicolour RGB display. Such implementation can be implemented by the cooperation of RGB light emitting structures with controlling electrode arrays.

FIGS. 2A to 2I and FIG. 3 demonstrate the application of an overlaid light emitting structure including partially reflective layers for improved light extraction to three-colour emitters. In particular, FIGS. 2A to 2I and 3 demonstrate an RGB LED light emitting structure.

Figure 2A:
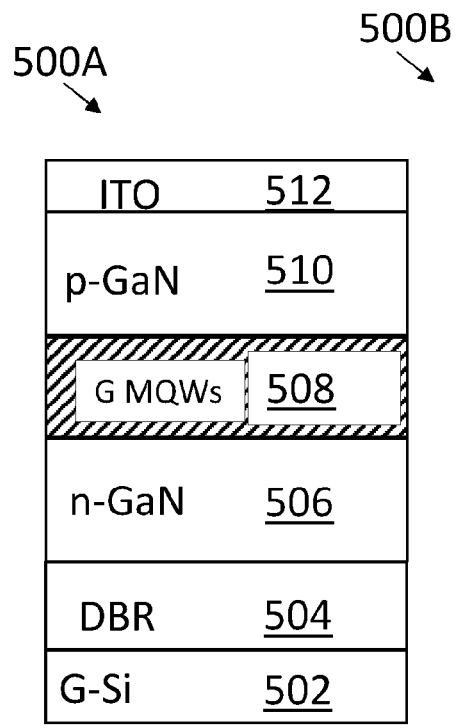
FIG. 2A shows a cross-sectional view of a green light emitting LED structure.

In FIG. 2A there is shown a substrate 502 upon which there is grown a partially reflective layer 504. The substrate 502 is a growth silicon substrate. The partially reflective layer 504 is a distributed Bragg reflector (DBR). In an example the DBR is formed on an n-type semiconductor layer using the method described in Zhang et al., *ACS*

*Photonics*, 2, 980 (2015). The partially reflective layer 504 is formed in a way that it reflects all wavelengths between 400 nm and 600 nm. Light of longer wavelengths, e.g., light with a wavelength of 605 nm, transmits through the partially reflective layer.

The partially reflective layer 504 is formed from alternating epitaxial crystalline layers of different refractive indices. The refractive indices of the layers, and the thicknesses of the layers, are selected in order to provide a reflectivity response as a function of the wavelength of light incident at the partially reflective layer 504. Further, the porosity of the epitaxial crystalline layers forming the partially reflective layer 504 is controlled in order to provide the desired reflectivity response as a function of wavelength.

In an example, alternating high and low refractive index layers form the partially reflective layer 504, whereby the thickness of each of the high ($n_H$) and low ($n_L$) refractive index layers is chosen so that the product of the thickness and the index of refraction of the layer is λ0/4, whereby λ0 is the central wavelength of a high reflectivity response between +/−λe around λ0 in accordance with the following equation:

$$\lambda e = \lambda 0 \left/ \left[ 1 - \left(\frac{2}{\pi}\right) \sin^{-1}\left(\frac{n_H - n_L}{n_H + n_L}\right) \right] \right.$$

FIG. 6A illustrates a cross sectional view of such alternating high and low refractive index layers 1600A forming a partially reflective layer, as well as an associated reflectivity response 1600B, as a function of wavelength. Alternating high and low refractive index layers 1600A start and terminate at the bottom and top of the structure with low refractive index layers that are half as thick (λ0/8 instead of λ0/4) as the other alternating layers in the structure 1600A, providing a Herpin-DBR, providing the reflectivity response at normal incidence angle seen at FIG. 6B.

FIG. 7A illustrates an alternative alternating high and low refractive index layer structure 1700A forming a partially reflective layer, as well as an associated reflectivity response 1700B. Alternating high and low refractive index layers 1700A start and terminate at the bottom and top of the structure with high refractive index layers that are half as thick (λ0/8 instead of λ0/4) as the other alternating layers in the structure 1600A, providing a Herpin-DBR with the reflectivity response at normal incidence angle seen at FIG. 7B.

The partially reflective layer 504 is formed based on the principles explained above with respect to the dual light emitting structure. Whilst the partially reflective layer 504 is formed in the above manner, alternatively, or additionally the structure and/or layers of the partially reflective layer 504 are formed from different layers and materials, with different porosities and thicknesses that provide the required reflectivity response.

Advantageously, the partially reflective layer 504 is formed as part of a continuous process that forms the light emitting structure 500A, thereby to provide higher quality material and reduce the processing burden.

Whilst the partially reflective layer 504 is a DBR, in further examples the partially reflective layer 504 is additionally, or alternatively formed using different methods whilst maintaining the functionality of enabling reflection of some wavelengths of light and transmission of different wavelengths of light.

On top of the partially reflective layer 504 there is an n-type region 506. The n-type region is n-doped Gallium Nitride (n-GaN). On top of the n-type region 506 there is a light emitting region 508. The light emitting region 508 is a green light emitting region 508. On top of the green light emitting region 508, there is grown a p-type region 510. The p-type region is p-doped Gallium Nitride (p-GaN). The light emitting structure 500A is based on a typical green LED structure. In further examples, alternative green LED structures are used, with additional or alternative layers.

Whilst the n-type region 506 is n-doped GaN, in further examples, additionally, or alternatively, the n-type region 506 comprises different materials. Whilst the p-type region 510 is p-doped GaN, in further examples, additionally, or alternatively, the p-type region 510 comprises different materials.

Whilst the growth of epitaxial GaN-based materials on a silicon growth substrate 502 is shown, in further examples, additional or alternative intervening layers are used in order to account for a lattice mismatch between the silicon growth substrate 502 and the subsequently grown layers, such as the partially reflective layer 504, the n-type region 506, the light emitting region 508 and the p-type region 510. In an example, the growth substrate 502 comprises silicon with an Aluminium Nitride (AlN) buffer layer.

Once the green light emitting structure 500A has been provided, a transparent conductive layer 512 is deposited on the green light emitting structure 500A. The transparent conductive layer 512 is an Indium Tin Oxide (ITO) layer. This is shown at FIG. 2A.

Whilst the transparent conductive layer 512 is an ITO layer, in further examples, additional or alternative material is used in order to provide a transparent conductive layer 512.

Once the light emitting structure 500A of FIG. 2A has been provided, the light emitting structure 500A is bonded to a handling device 516 using a bonding layer 514. This is shown in the light emitting structure 500B of FIG. 2B. The handling device 516 is a silicon handling wafer 516. The silicon handling wafer 516 is bonded to the transparent conductive layer 512 of the light emitting structure 500A of FIG. 2A using a bonding layer 514 of optical transparent adhesive (OCA).

The bonding layer 514, which is OCA advantageously has excellent transparency and insulation properties. Whilst the bonding layer 514 is OCA in the example of FIG. 2B, in further examples, additionally, or alternatively, the bonding layer 112 is formed using different means, including adhesive and mechanical means.

Figure 2B:
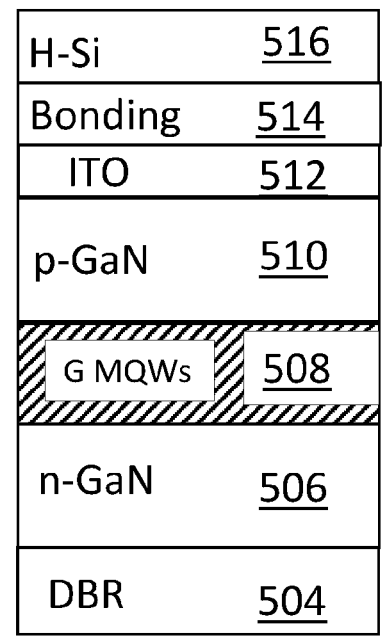
FIG. 2B shows a cross-sectional view of the green light emitting LED structure of FIG. 2A bonded to a handling wafer.

Once the handling wafer 516 has been bonded using bonding layer 514 to the light emitting structure 500A, the substrate 502 of the light emitting structure 500A is removed. This is shown in FIG. 2B, where there is a light emitting structure 500B that is a processed version of the light emitting structure 500A shown in FIG. 2A. The light emitting structure 500A of FIG. 2A is processed to provide the light emitting structure 500B of FIG. 2B by removal of the substrate 502. Removal of the substrate 502, which is a growth silicon wafer, is performed using a wet etch. In an example, the wet etch uses KOH solution, hydrofluoric acid and nitric acid and BOE. In further examples, additional or alternative methods are used to remove the substrate 502. Additionally, or alternatively, dry etching techniques are used to remove additional layers, such as buffer layers that have been formed between the substrate 502 and the remainder of the light emitting structure.

Figure 2C:
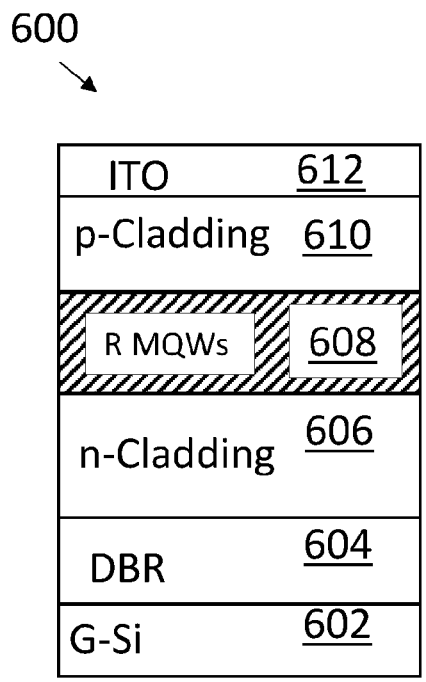
FIG. 2C shows a cross-sectional view of a red light emitting LED structure.

In addition to the provision of the process green light emitting LED structure 500B, there is provided a red light emitting structure 600, as shown at FIG. 2C. FIG. 2C shows a typical red light emitting LED structure 600 with an additional partially reflective layer. There is shown a substrate 602 upon which there is a partially reflective layer 604, upon which there is an n-type region 606. Upon the n-type region 606 there is shown a red light emitting region 608. On top of the light emitting region 608 there is shown a p-type region 610. The red light emitting structure 600 of FIG. 2C is provided in an analogous manner to the green light emitting structure 500A of FIG. 2A.

In FIG. 2C there is shown a substrate 602 upon which there is grown a partially reflective layer 604. The substrate 602 is a growth silicon substrate. The partially reflective layer 604 is a distributed Bragg reflector (DBR). In an example the DBR is formed on an n-type semiconductor layer using the method described in Zhang et al., *ACS Photonics*, 2, 980 (2015). The partially reflective layer 604 is formed in a way that it reflects all wavelengths between 400 nm and 780 nm.

The partially reflective layer 604 is formed from alternating epitaxial crystalline layers of different refractive indices. The refractive indices of the layers, and the thicknesses of the layers, are selected in order to provide a reflectivity response as a function of the wavelength of light incident at the partially reflective layer 604. Further, the porosity of the epitaxial crystalline layers forming the partially reflective layer 604 is controlled in order to provide the desired reflectivity response as a function of wavelength.

In an example, alternating high and low refractive index layers form the partially reflective layer 604, whereby the thickness of each of the high ($n_H$) and low ($n_L$) refractive index layers is chosen so that the product of the thickness and the index of refraction of the layer is $\lambda 0/4$, whereby $\lambda 0$ is the central wavelength of a high reflectivity response between $+/-\lambda e$ around $\lambda 0$ in accordance with the following equation:

$$\lambda e = \lambda 0 \bigg/ \left[1 - \left(\frac{2}{\pi}\right) \sin^{-1}\left(\frac{n_H - n_L}{n_H + n_L}\right)\right]$$

FIG. 6A illustrates a cross sectional view of such alternating high and low refractive index layers 1600A forming a partially reflective layer, as well as an associated reflectivity response 1600B, as a function of wavelength. Alternating high and low refractive index layers 1600A start and terminate at the bottom and top of the structure with low refractive index layers that are half as thick ($\lambda 0/8$ instead of $\lambda 0/4$) as the other alternating layers in the structure 1600A, providing a Herpin-DBR, providing the reflectivity at normal incidence angle response seen at FIG. 6B.

FIG. 7A illustrates an alternative alternating high and low refractive index layer structure 1700A forming a partially reflective layer, as well as an associated reflectivity response 1700B. Alternating high and low refractive index layers 1700A start and terminate at the bottom and top of the structure with high refractive index layers that are half as thick($\lambda 0/8$ instead of $\lambda 0/4$) as the other alternating layers in the structure 1600A, providing a Herpin-DBR with the reflectivity response at normal incidence angle seen at FIG. 7B.

The partially reflective layer 604 is formed based on the principles explained above with respect to the dual light emitting structure. Whilst the partially reflective layer 604 is formed in the above manner, alternatively, or additionally the structure and/or layers of the partially reflective layer 604 are formed from different layers and materials, with different porosities and thicknesses that provide the required reflectivity response.

Advantageously, the partially reflective layer 604 is formed as part of a continuous process that forms the light emitting structure 600, thereby to provide higher quality material and reduce the processing burden.

Whilst the partially reflective layer 604 is a DBR, in further examples the partially reflective layer 604 is additionally, or alternatively formed using different methods whilst maintaining the functionality of enabling reflection of some wavelengths of light and transmission of different wavelengths of light.

On top of the partially reflective layer 604 there is an n-type region 606. The n-type region is n-doped Gallium Nitride (n-GaN). On top of the n-type region 606 there is a light emitting region 608. The light emitting region 608 is a red light emitting region 608. On top of the green light emitting region 608, there is grown a p-type region 610. The p-type region is p-doped Gallium Nitride (p-GaN). The light emitting structure 600 is based on a typical red LED structure. In further examples, alternative red LED structures are used, with additional or alternative layers.

Whilst the n-type region 606 is n-doped GaN, in further examples, additionally, or alternatively, the n-type region 606 comprises different materials. Whilst the p-type region 610 is p-doped GaN, in further examples, additionally, or alternatively, the p-type region 610 comprises different materials.

Whilst the growth of epitaxial GaN-based materials on a silicon substrate 602 is shown, in further examples, additional or alternative intervening layers are used in order to account for a lattice mismatch between the silicon growth substrate 602 and the subsequently grown layers, such as the partially reflective layer 604, the n-type region 606, the light emitting region 608 and the p-type region 610. In an example, the growth substrate 602 comprises silicon with an Aluminium Nitride (AlN) buffer layer.

Once the green light emitting structure 500B and the red light emitting structure 600 have been provided, they are bonded together. FIG. 2D shows an effectively dual colour LED structure 700A, whereby the green light emitting structure 500B is bonded to the red light emitting structure 600 such that the partially reflective layer 504 of the processed light emitting structure 500B is bonded to the transparent conductive layer 612 deposited on the p-type region 610 of the light emitting structure 600. The green light emitting structure 500B is bonded to the red light emitting structure 600 using a bonding layer 702 that is an OCA adhesive.

Whilst the bonding layer 702 is formed from OCA. In further examples, additional or alternative materials are used to form the bonding layer 702.

Once the effectively dual colour LED structure 700A of FIG. 2D has been provided, it is processed to provide the structure 700B shown at FIG. 2E.

FIG. 2E shows a processed dual colour light emitting structure 700A of the dual colour LED structure 700A of FIG. 2D, whereby the handling wafer 516 and the bonding layer 514 have been removed.

Figures 2F, 2G, 2H:
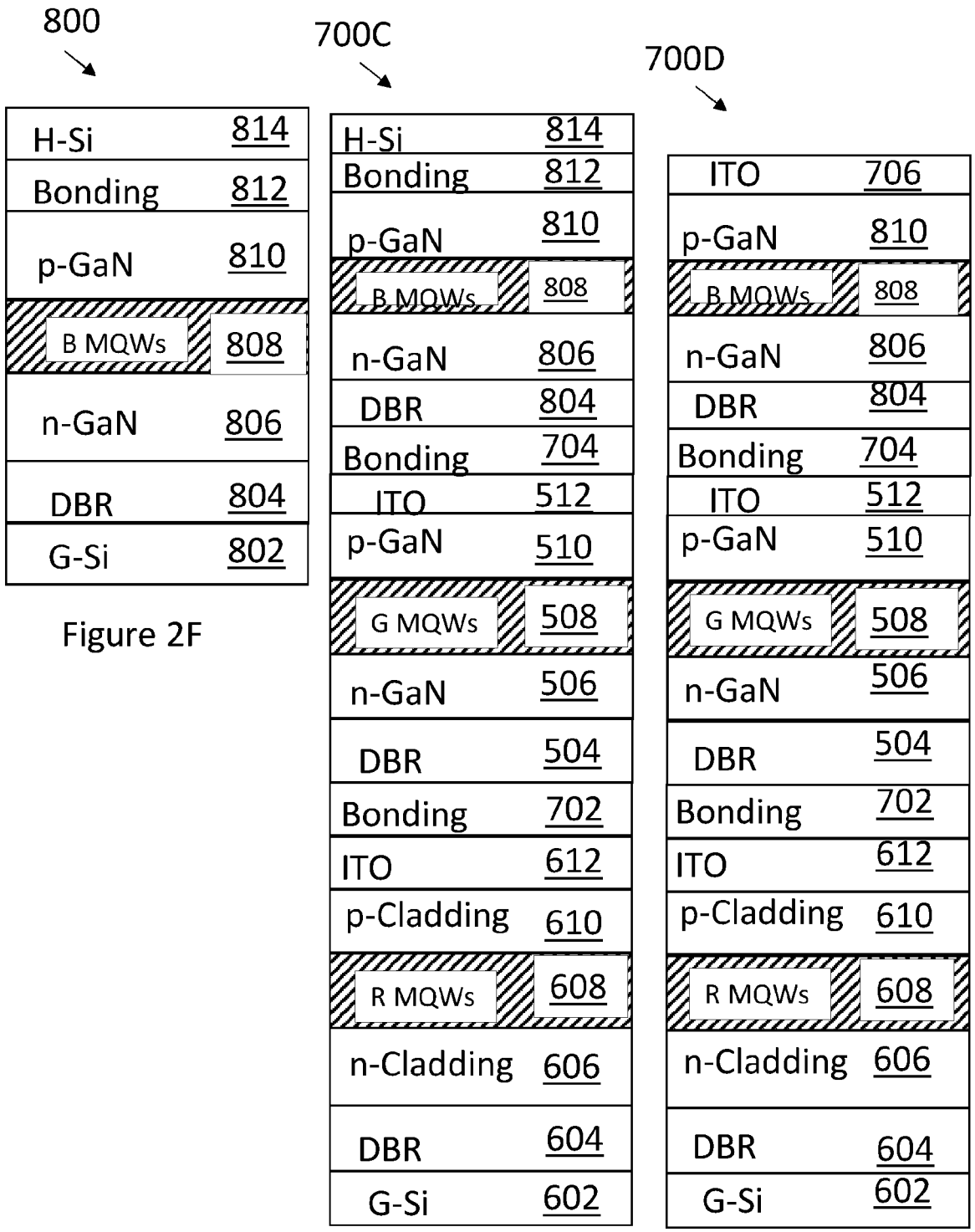
FIG. 2F shows a cross-sectional view of a blue light emitting LED structure.
FIG. 2G shows the structures of FIG. 2E and FIG. 2F bonded together to form a RGB LED structure.
FIG. 2H shows a cross-sectional view of a processed version of the structure of FIG. 2G.

In addition to the provision of the effective dual colour LED structure 700B, a blue light emitting structure 800 is provided. FIG. 2F shows a typical blue light emitting LED structure 800 with an additional partially reflective layer. There is shown a substrate 802 upon which there is a partially reflective layer 804, upon which there is an n-type region 806. Upon the n-type region 806 there is shown a blue light emitting region 808. On top of the light emitting region 808 there is shown a p-type region 810. The blue light emitting structure 800 of FIG. 2F is provided in an analogous manner to the red and green light emitting structures 500A, 600 of FIGS. 2A, 2C.

FIG. 2F shows a light emitting structure 800 that is a blue light emitting LED structure. There is shown a stack of epitaxial compound semiconductor crystalline layers. The epitaxial compound semiconductor crystalline layers are provided by sequential growth of the layers on a substrate 802.

In FIG. 2F there is shown a substrate 802 upon which there is grown a partially reflective layer 804. The substrate 802 is a growth silicon substrate. The partially reflective layer 804 is a distributed Bragg reflector (DBR). In an example the DBR is formed on an n-type semiconductor layer using the method described in Zhang et al., *ACS Photonics*, 2, 980 (2015). The partially reflective layer 804 is formed in a way that it reflects all wavelengths between 400 nm and 500 nm.

The partially reflective layer 804 is formed from alternating epitaxial crystalline layers of different refractive indices. The refractive indices of the layers, and the thicknesses of the layers, are selected in order to provide a reflectivity response as a function of the wavelength of light incident at the partially reflective layer 804. Further, the porosity of the epitaxial crystalline layers forming the partially reflective layer 804 is controlled in order to provide the desired reflectivity response as a function of wavelength.

In an example, alternating high and low refractive index layers form the partially reflective layer 804, whereby the thickness of each of the high ($n_H$) and low ($n_L$) refractive index layers is chosen so that the product of the thickness and the index of refraction of the layer is $\lambda 0/4$, whereby $\lambda 0$ is the central wavelength of a high reflectivity response between $+/-\lambda e$ around $\lambda 0$ in accordance with the following equation:

$$\lambda e = \lambda 0 \bigg/ \left[ 1 - \left(\frac{2}{\pi}\right) \sin^{-1}\left(\frac{n_H - n_L}{n_H + n_L}\right) \right]$$

FIG. 6A illustrates a cross sectional view of such alternating high and low refractive index layers 1600A forming a partially reflective layer, as well as an associated reflectivity response 1600B, as a function of wavelength. Alternating high and low refractive index layers 1600A start and terminate at the bottom and top of the structure with low refractive index layers that are half as thick ($\lambda 0/8$ instead of $\lambda 0/4$) as the other alternating layers in the structure 1600A, providing a Herpin-DBR, providing the reflectivity response at normal incidence angle seen at FIG. 6B.

FIG. 7A illustrates an alternative alternating high and low refractive index layer structure 1700A forming a partially reflective layer, as well as an associated reflectivity response 1700B. Alternating high and low refractive index layers 1700A start and terminate at the bottom and top of the structure with high refractive index layers that are half as thick ($\lambda 0/8$ instead of $\lambda 0/4$) as the other alternating layers in the structure 1600A, providing a Herpin-DBR with the reflectivity response at normal incidence angle seen at FIG. 7B.

The partially reflective layer 804 is formed based on the principles explained above with respect to the dual light emitting structure. Whilst the partially reflective layer 604 is formed in the above manner, alternatively, or additionally the structure and/or layers of the partially reflective layer 604 are formed from different layers and materials, with different porosities and thicknesses that provide the required reflectivity response.

Advantageously, the partially reflective layer 804 is formed as part of a continuous process that forms the light emitting structure 800, thereby to provide higher quality material and reduce the processing burden.

Whilst the partially reflective layer 804 is a DBR, in further examples the partially reflective layer 804 is additionally, or alternatively formed using different methods whilst maintaining the functionality of enabling reflection of some wavelengths of light and transmission of different wavelengths of light.

On top of the partially reflective layer 804 there is an n-type region 806. The n-type region is n-doped Gallium Nitride (n-GaN). On top of the n-type region 806 there is a light emitting region 808. The light emitting region 808 is a blue light emitting region 808. On top of the blue light emitting region 808, there is grown a p-type region 810. The p-type region is p-doped Gallium Nitride (p-GaN). The light emitting structure 800 is based on a typical blue LED structure. In further examples, alternative blue LED structures are used, with additional or alternative layers.

Whilst the n-type region 806 is n-doped GaN, in further examples, additionally, or alternatively, the n-type region 806 comprises different materials. Whilst the p-type region 810 is p-doped GaN, in further examples, additionally, or alternatively, the p-type region 810 comprises different materials.

Whilst the growth of epitaxial GaN-based materials on a silicon substrate 802 is shown, in further examples, additional or alternative intervening layers are used in order to account for a lattice mismatch between the silicon growth substrate 802 and the subsequently grown layers, such as the partially reflective layer 804, the n-type region 806, the light emitting region 808 and the p-type region 810. In an example, the growth substrate 802 comprises silicon with an Aluminium Nitride (AlN) buffer layer.

Once the light emitting structure 800 of FIG. 2F has been provided, the light emitting structure 800 is bonded to a handling wafer 814 using a bonding layer 812. This is shown in FIG. 2F. The handling device 814 is a silicon handling wafer 814. The handling device 814 is bonded to the p-type region of the light emitting structure 800 of FIG. 2F using a bonding layer 812 of optical transparent adhesive (OCA).

The bonding layer 812, which is OCA advantageously has excellent transparency and insulation properties. Whilst the bonding layer 812 is OCA in the example of FIG. 2F, in further examples, additionally, or alternatively, the bonding layer 812 is formed using different means, including adhesive and mechanical means.

Once the handling wafer 814 has been bonded using bonding layer 812 to the light emitting structure 800, the substrate 802 of the light emitting structure 800 is removed (not shown). Removal of the substrate 802, which is a growth silicon wafer, is performed using a wet etch. In an example, the wet etch uses KOH solution, hydrofluoric acid and nitric acid and BOE. In further examples, additional or alternative methods are used to remove the substrate 802. Additionally, or alternatively, dry etching techniques are used to remove additional layers, such as buffer layers that have been formed between the substrate 802 and the remainder of the light emitting structure.

The light emitting structures 500B, 600, 800 shown at FIGS. 2B, 2C and 2F, respectively, differ from conventional LED structures at least insofar as they have a partially reflective layer 504, 604, 804 positioned at least partially in between the substrate and n-type regions of the structures 500B, 600, 800.

Once the blue light emitting structure 800, with its substrate 802 removed, and the dual red and green light emitting structure 700B have been provided, they are bonded together to form a RGB light emitting structure 700C, as shown at FIG. 2G.

FIG. 2G shows a RGB colour LED structure 700C, whereby the light emitting structure 700A processed to provide the dual red and green colour light emitting structure 700B is bonded to the blue light emitting structure 800 such that the partially reflective layer 804 of the blue light emitting structure 800 is bonded to the transparent conductive layer 512 deposited on the p-type region 510 of the light emitting structure 700B. The dual red and green colour light emitting structure 700B is bonded to the blue light emitting structure 800 using a bonding layer 704 that is an OCA adhesive.

Whilst the bonding layer 704 is formed from OCA. In further examples, additional or alternative materials are used to form the bonding layer 704.

Once the RGB colour LED structure 700C of FIG. 2G has been provided, it is processed to provide the structure 700D shown at FIG. 2H.

FIG. 2H shows a processed RGB colour light emitting structure 700D of the RGB colour LED structure 700C of FIG. 2G, whereby the handling wafer 814 and the bonding layer 812 have been removed. Once the handling wafer 814 and the bonding layer 812 have been removed, as shown at FIG. 2H, a transparent conductive layer 706 is formed on the p-type region 810 of the RGB light emitting structure 700D.

FIG. 2H shows the dual light emitting structure 700C of FIG. 2G that has been processed in order to provide a transparent conductive layer 706 on top of the p-type region 810. The transparent conductive layer 706 is ITO deposited on the p-type region 810. In further examples, the transparent conductive layer 706 is formed from additional or alternative material.

Figure 2I:
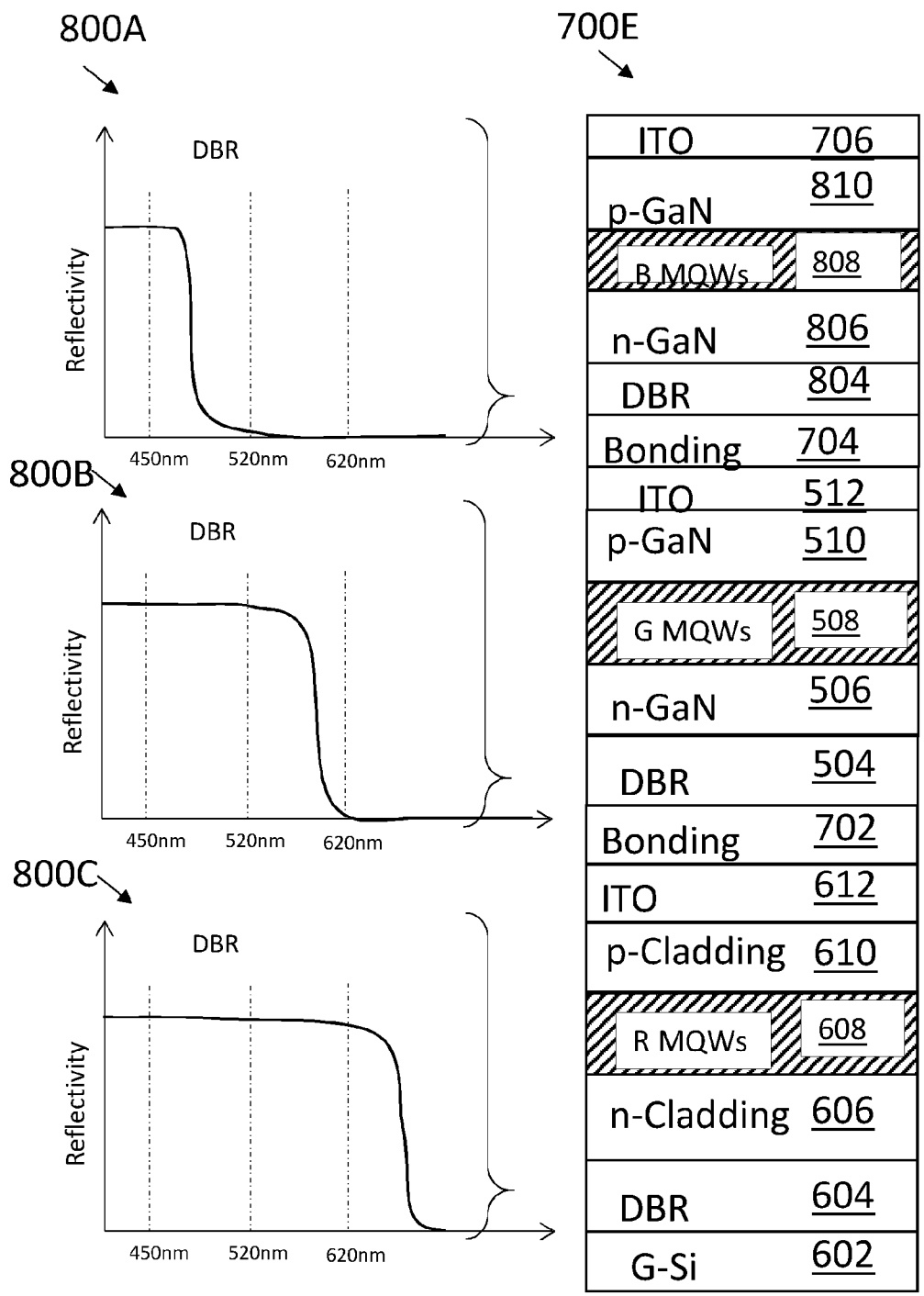
FIG. 2I shows a cross-sectional view of a RGB LED structure.

The reflectivity properties of the partially reflective layers 604, 504, 804 are shown at FIG. 2I. The reflectivity response, as a function of wavelength of light, of the partially reflective layer 804 is such that blue light is reflected and green and red light are allowed to pass through it, this reflectivity response is shown at 800A, by virtue of a reflectivity step change between 450 nm and 520 nm wavelengths of light.

The reflectivity response 800B, as a function of wavelength of light, of the partially reflective layer 504 is shown at FIG. 2I. Accordingly, blue and green wavelengths are shown to be reflected. The step change of reflectivity does not occur until substantially after 520 nm, such that blue and green light are reflected, but red light can pass through the partially reflective layer 504.

The reflectivity response 800C, as a function of wavelength of light, of the partially reflective layer 604 is also shown at FIG. 2I. Accordingly, blue, green and red wavelengths are shown to be reflected. The step change of reflectivity, as a function of wavelength of light, does not occur until substantially after 620 nm.

Advantageously, the structure 700E is arranged such that longer wavelength light passes through the partially reflective layers 504, 804, whilst the short wavelength light from the blue light emitting region 808 does not pass through the partially reflective layer 804 and therefore does not result in photoluminescence in the longer wavelength light emitting regions 508, 608. Similarly, light emitted from the green light emitting region 508 does not illuminate the longer wavelength red light emitting region 608 because the green light does not pass through the partially reflective layer 504 and therefore does not result in photoluminescence in the red light emitting region 608 as a result of illumination by the shorter wavelength green light.

Whilst the partially reflective layers 604, 504, 804 are configured to enable reflection and transmission of red, green and blue primary peak wavelengths in order to optimise light extracted through the top of the dual light emitting structure 700E, in further examples, alternative or additional light emitting regions 608, 508, 808 and partially reflective layers 604, 504, 804 are used in order to optimise the light production of different wavelengths of light. The RGB light emitting structure 700E with the properties described in relation to the partially reflective layers is processed in order to provide a RGB LED.

The structure described with respect to FIG. 2A to 2I can be processed in a manner analogous to that of the dual colour LED of FIG. 1A to FIG. 1L, in order to provide electrical contacts to enable excitation of the light emitting regions 608, 508, 808 by injection of carriers into the light emitting regions 608, 508, 808. For example, the RGB colour LED structure 700D of FIG. 2H is then processed such that a handling wafer is bonded using a bonding layer to the transparent conductive layer 706 of the light emitting RGB colour light emitting structure 700D. The handling wafer is a silicon wafer bonded to the transparent conductive layer 706 using a bonding layer formed of OCA. In further examples, additional or alternative materials are used in the bonding layer. In yet further examples, additional or alternative material is used in the handling wafer.

Once the RGB colour LED structure 700D of FIG. 2H has been provided, the growth substrate 602 is removed. Removal of the substrate 602, which is a growth silicon wafer, is performed using a wet etch. In an example, the wet etch uses KOH solution, hydrofluoric acid and nitric acid and BOE. In further examples, additional or alternative methods are used to remove the substrate 602. Additionally, or alternatively, dry etching techniques are used to remove additional layers, such as buffer layers that have been formed between the substrate 602 and the remainder of the light emitting structure.

Once the substrate 602 has been removed, electrical contacts are formed in a structure.

The formation of electrical enables carrier injection into each of the light emitting regions 608, 508, 808. This is achieved by providing an electrical contact pair to the n-type region 606 and p-type region 610 for the red light emitting region 608, by providing an electrical contact pair to the n-type region 506 and the p-type region 510 for the green light emitting region 508 and by providing an electrical contact pair to the n-type region 806 and the p-type region 810 for the blue light emitting region 808.

Figure 3:
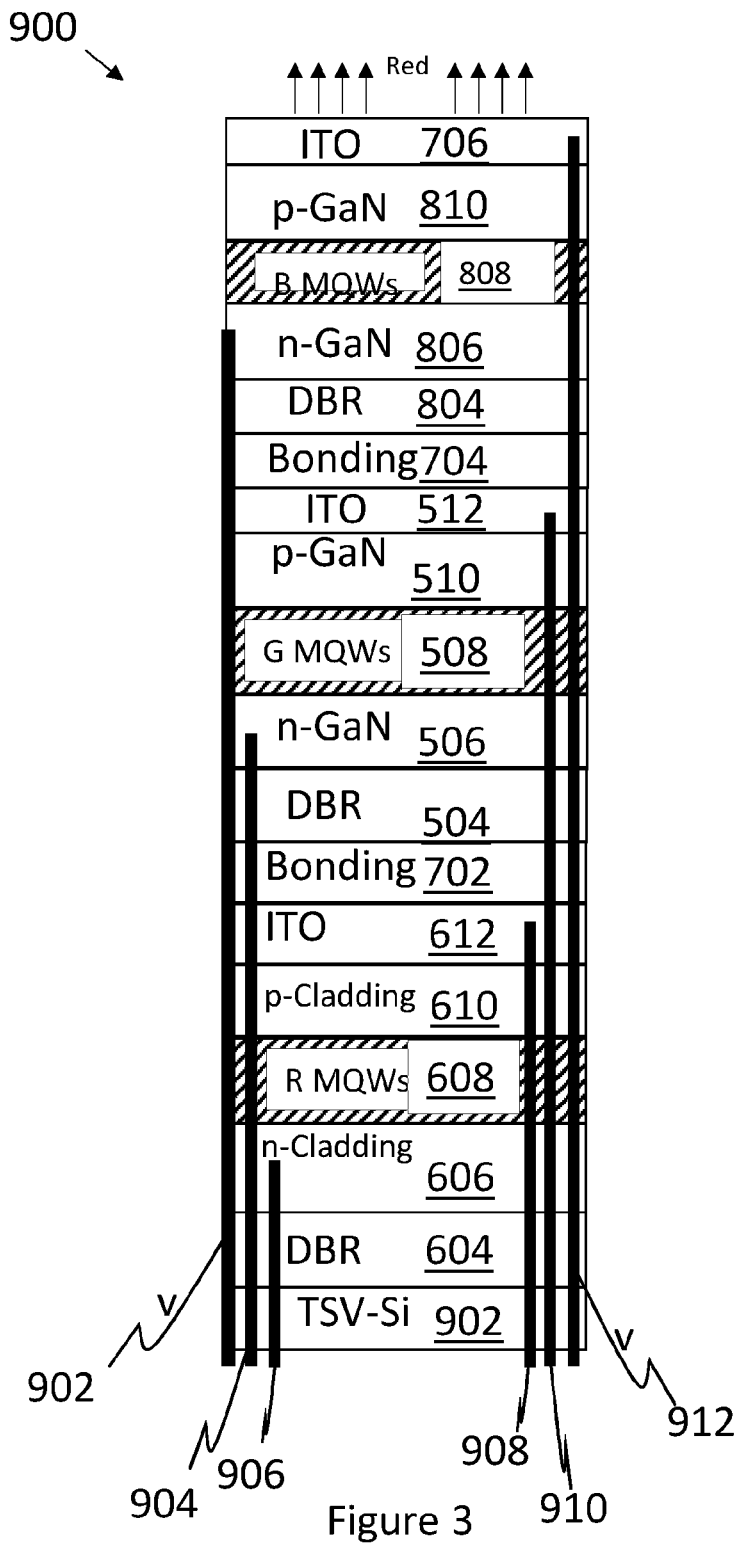
FIG. 3 shows a cross-sectional view of a RGB LED.

This is shown at FIG. 3, where the RGB colour light emitting structure 900 is shown to have vias 902, 904, 906, 908, 910, 912 formed selectively through the structure 900. The vias 902, 904, 906, 908, 910, 912 are formed by selectively etching through the RGB colour light emitting structure 900. This is achieved using photo-lithographical techniques based on patterning of resist layers deposited on the dual colour light emitting structure 900. In further examples, alternative or additional techniques are used to form the vias 902, 904, 906, 908, 910, 912.

The vias 902, 904, 906, 908, 910, 912 are formed such that they penetrate the light emitting structure 900 to provide electrical contact to enable carrier injection into the light emitting regions 608, 508, 808.

Via 902 is formed to pass through the partially reflective region 604, the n-type region 606, the light emitting region 608, the p-type region 610, the transparent conductive layer 612, the bonding layer, the partially reflective layer 504, the n-type region 506, the light emitting region 508, the p-type region 510, the transparent conductive region 512, the bonding layer 704 and the partially reflective layer 804 to enable the formation of an electrical contact with the n-type region 806. Accordingly, the via 902 provides a passage to the n-type region 806.

Similarly, there is shown a via 904 passing through the partially reflective region, shown as partially reflective layer 604 to the n-type region 506 and a via 906 passing to the n-type region 606. The vias 902, 904 and 906 to the n-type regions provide passages which to form contacts with the n-type regions associated with their respective light emitting regions 808, 508, 608.

Via 912 is shown to be formed through the partially reflective layer 604, the n-type region 606, the light emitting region 608, the p-type region 610, the transparent conductive layer 612, the bonding layer, the partially reflective layer 504, the n-type region 506, the light emitting region 508, the p-type region 510, the transparent conductive region 512, the bonding layer 704, the partially reflective layer 804, the n-type region 806, the light emitting region 808 and the p-type region 810, to enable the formation of an electrical contact with transparent conductive layer 706. The transparent conductive layer 706 is in electrical contact with the p-type region 810 and therefore enables distribution of carriers across the breadth of the light emitting region 808, in view of the relatively lower electrical conductivity of the p-type region. In further examples, the transparent conductive layer 706 is not required to serve this function and the via 912 is instead formed to provide electrical connection with the p-type region 810 directly.

Via 910 is shown to be formed to pass through partially reflective layer 604, n-type region 606, light emitting region 608, p-type region 610, transparent conductive layer 612, bonding layer 702, partially reflective layer 504, n-type region 506, light emitting region 508 and p-type region 510 to enable formation of an electrical connection with the transparent conductive layer 512. The transparent conductive layer 512 is in electrical contact with the p-type region 510 and therefore enables distribution of carriers across the breadth of the light emitting region 508, in view of the relatively lower electrical conductivity of the p-type region. In further examples, the transparent conductive layer 512 is not required to serve this function and the via 910 is instead formed to provide electrical connection with the p-type region 510 directly.

Via 908 is shown to be formed to pass through partially reflective layer 604, n-type region 606, light emitting region 608 and p-type region 610 to enable formation of an electrical connection with the transparent conductive layer 612. The transparent conductive layer 612 is in electrical contact with the p-type region 610 and therefore enables distribution of carriers across the breadth of the light emitting region 608, in view of the relatively lower electrical conductivity of the p-type region. In further examples, the transparent conductive layer 612 is not required to serve this function and the via 908 is instead formed to provide electrical connection with the p-type region 610 directly.

Therefore, the vias 908, 910, 912 provide routes to enable the formation of electrical connections to the p-type regions associated with each of the light emitting regions 608, 508, 808, respectively.

Accordingly, one pair of vias 902, 912 provide the means to form an electrode pair in respect of the blue light emitting region 808. Another pair of vias 904, 910 provide the means to form an electrode pair in respect of the green light emitting region 508. The other pair of vias 906, 908 provide the means to form an electrode pair in respect of the red light emitting region 608.

In order to form contacts with the respective regions of the red, green and blue light emitting region 608, 508, 808, an insulator layer may be formed on the inner wall of each of the vias 902, 904, 906, 908, 910, 912.

Once the vias 902, 904, 906, 908, 910, 912 have been insulated such that electrical connection to the desired region can be established, a conductive material is formed in each of the vias 902, 904, 906, 908, 910, 912. The conductive material is metal that is plated in the insulated vias 902, 904, 906, 908, 910, 912. In further examples, the conductive material is additional or alternative material and, in further examples, the conductive material is deposited using other techniques, thereby to provide electrical contact to the regions in which the vias 902, 904, 906, 908, 910, 912 contact.

In order to enable controlled electrical connection in order to inject carriers into the light emitting regions 608, 508, 808, the RGB colour light emitting structure 900 of FIG. 3 is processed further.

FIG. 3 shows an additional through silicon via 902 bonded and aligned to make connection with the electrodes that are formed in the vias 902, 904, 906, 908, 910, 912.

The through silicon via 902 is bonded to the partially reflective layer 604 of the structure 900 via a bonding layer (not shown). Once electrical contacts have been made to the light emitting structures, the handling wafer and bonding layer may be removed from the structure 900.

Removal of the handling wafer and bonding layer provides a RGB colour LED structure 900 as shown at FIG. 3. The light emitting structure of FIG. 3 is configured to emit light through the conductive transparent layer 706.

Advantageously, the partially reflective layer 604 is configured to substantially reflect red light. Further, the partially reflective layer 504 is configured to allow red light substantially to pass through it and to be emitted via the transparent conductive layer 706, whilst preventing green light from passing from the green light emitting region 508 to the red light emitting region 608 by virtue of substantially reflecting green light. Beneficially, green light that would otherwise excite emission in the red light emitting region 608 is prevented from doing so.

Advantageously, the partially reflective layer 804 is configured to allow red and green light substantially to pass through it and to be emitted via the transparent conductive layer 706, whilst preventing blue light from passing from the blue light emitting region 808 to the red light emitting region 608, or the green light emitting region 508, by virtue of substantially reflecting red and green light. Beneficially, blue light that would otherwise excite emission in the red and green light emitting regions 608, 508 is prevented from doing so.

Beneficially, there is improved light emission through the top of the structure via transparent conductive layer 706.

The light emitting structures described with reference to FIGS. 2 and 3 are formed using epitaxial compound semiconductor growth techniques such as metalorganic chemical vapour deposition (MOCVD) and molecular beam epitaxy.

The growth of the epitaxial crystalline compound semiconductor layers described above is done using growth/deposition on silicon wafers. Alternatively, or additionally, other wafers are used, such as sapphire wafers or freestanding gallium nitride (GaN) wafers, for example.

Whilst certain epitaxial crystalline compound semiconductor layers are shown in FIGS. 2 and 3, the skilled person understands that alternative, or additional, layers are used in further examples. Further, in some examples, some of the epitaxial crystalline compound semiconductor layers are removed whilst maintaining the essence of the concepts described herein.

The light emitting structures described with respect to FIGS. 2 and 3 are formed from nitride-based materials. In particular, the epitaxial crystalline compound semiconductor layers are gallium nitride (GaN) based materials. Whilst the structures described in relation to FIGS. 2 and 3 relate to nitride-based semiconductor compound materials, the skilled person understands that the concepts described herein are applicable to other semiconductor materials, for example other III-V compound semiconductor materials, or II-VI compound semiconductor materials.

The light emitting regions 608, 508, 808 are formed to include multiple quantum wells (MQWs). The blue light emitting region 808 includes MQWs that are configured to emit light with a primary peak wavelength that is blue, when carriers radiatively combine in the MQWs. The MQWs are formed from Indium Gallium Nitride (InGaN) that is epitaxially grown between GaN-based layers with the composition of the individual quantum wells being tailored to provide the desired wavelength of light that can be emitted from them. Whilst MQWs are described in the light emitting region 608, 508, 808, alternatively a single quantum well (SQW) layer is used. In further examples the light emitting region 608, 508, 808 comprises quantum dots (QDs) that are configured to emit light when carriers radiatively combine in the QDs. Whilst the primary peak wavelength of light emitted from the light emitting region 808 is configured to be blue, in further examples, the light emitting region 808 is additionally, or alternatively, configured to emit light with a different primary peak wavelength.

The green light emitting region 508 includes MQWs that are configured to emit light with a primary peak wavelength that is green, when carriers radiatively combine in the MQWs. The MQWs are formed from Indium Gallium Nitride (InGaN) that is epitaxially grown between GaN-based layers with the composition of the individual quantum wells being tailored to provide the desired wavelength of light that can be emitted from them. Whilst MQWs are described in the light emitting region 508, alternatively a single quantum well (SQW) layer is used. In further examples the light emitting region 508 comprises quantum dots (QDs) that are configured to emit light when carriers radiatively combine in the QDs. Whilst the primary peak wavelength of light emitted from the light emitting region 508 described is configured to be green, in further examples, the light emitting region 508 is additionally, or alternatively, configured to emit light with a different primary peak wavelength.

The red light emitting region 608 includes MQWs that are configured to emit light with a primary peak wavelength that is red, when carriers radiatively combine in the MQWs. The MQWs are formed from Indium Gallium Nitride (InGaN) that is epitaxially grown between GaN-based layers with the composition of the individual quantum wells being tailored to provide the desired wavelength of light that can be emitted from them. Whilst MQWs are described in the light emitting region 608, alternatively a single quantum well (SQW) layer is used. In further examples the light emitting region 608 comprises quantum dots (QDs) that are configured to emit light when carriers radiatively combine in the QDs. Whilst the primary peak wavelength of light emitted from the light emitting region 608 is configured to be red, in further examples, the light emitting region 608 is additionally, or alternatively, configured to emit light with a different primary peak wavelength.

Whilst the partially reflective layer 604 described with reference to the RGB light emitting structure of FIGS. 2 and 3 is shown to be a DBR, in further examples, additionally or alternatively a reflective layer, such as a metal layer is used. Beneficially, as the partially reflective layer 604 is at the bottom of the top-emitting LED structure, light hitting the reflective layer is reflected to the top of the LED for emission.

In further examples, additional or alternative light emitting structures and/or associated partially reflective layers are implemented. For example in multicolour structures emitting four different colours of light at four different wavelengths of light.

Further, the skilled person understands that the provision of the multi light emitting LED structure in the manner described results in the efficient and high quality generation of material with reduced processing steps, by incorporating layers in the structure at either in the process of forming the individual light emitting structures, or in the processing steps involved in bring those individual light emitting structures together and processing the resultant structure. However, the skilled person further understands that in further examples, additional or alternative steps are used to form the structure and the order of the steps is chosen to provide different or additional benefits.

Figure 4A:
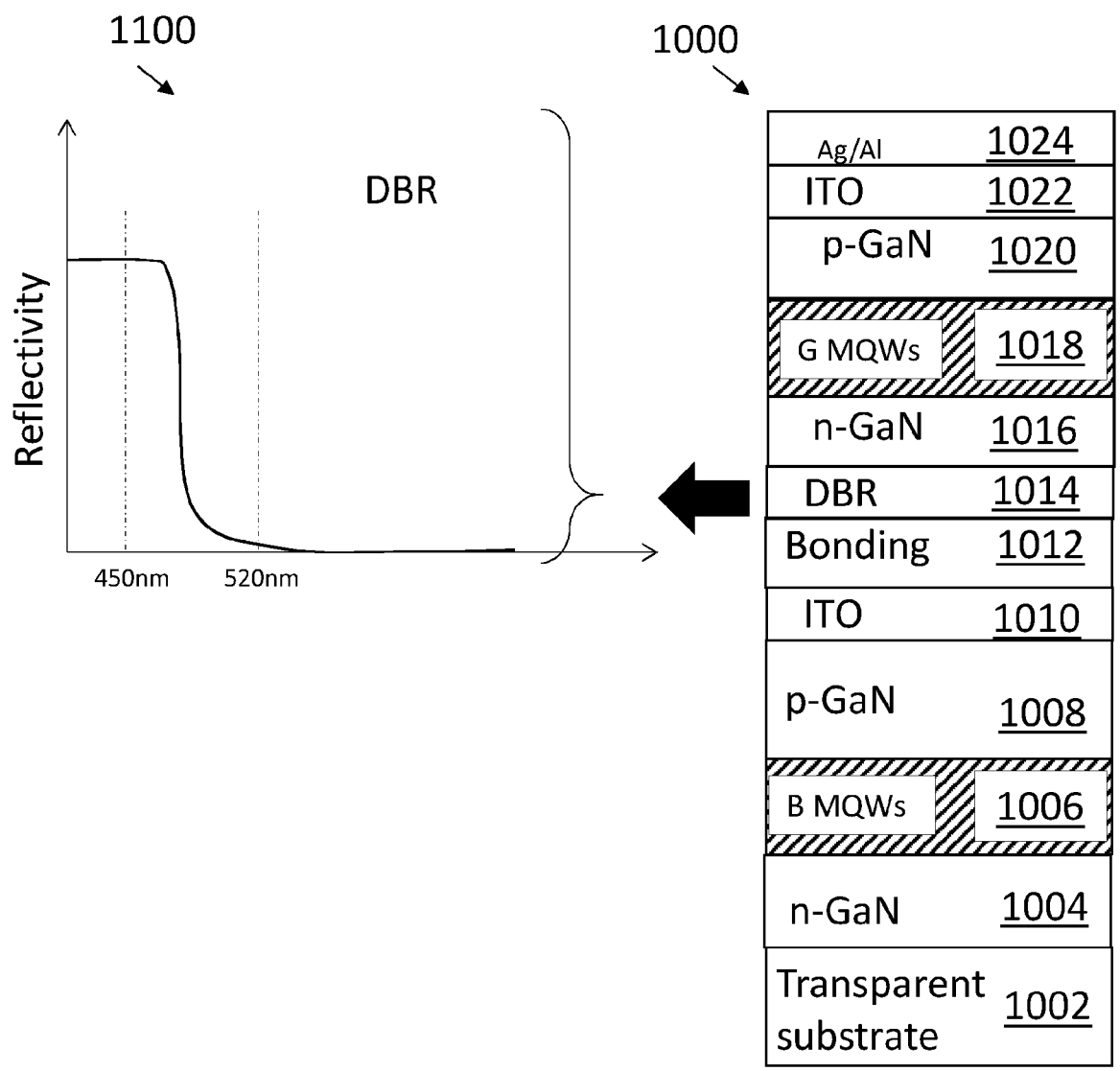
FIG. 4A shows a cross-sectional view of a dual colour LED structure.

Whilst the structure described with reference to FIGS. 1A to 1L is configured in order to emit light from the top surface of the structure with respect to the original growth substrates defining the bottom, and hence starting point for subsequent growth of epitaxial layers, in other examples, the order of the light emitting regions is reversed. This is shown at FIG. 4A, for example. FIG. 4A shows a dual light emitting structure 1000 formed on a transparent substrate 1002. There is shown a n-type layer 1004 formed on the transparent substrate 1002, a blue light emitting region 1006 formed on the n-type layer 1004 and a p-type layer 1008 formed on the blue light emitting region 1006. In a similar manner as described above, a blue light emitting structure formed on a transparent substrate 1002 is bonded to a green light emitting structure using a bonding layer 1012 that bonds together the partially reflective layer 1014 of the green light emitting structure and a transparent conductive layer 1010 of the blue light emitting structure. The green light emitting structure has a n-type layer 1016 formed on a DBR 1014. On the n-type layer 1016 there is formed a green light emitting region 1018. On the green light emitting region there is formed a p-type region 1020.

The dual colour light emitting structure has a transparent conductive layer 1022 formed on the p-type region 1020 of the green light emitting structure and a reflective metal layer 1024 formed on the transparent conductive layer 1022. Advantageously, this structure includes only one partially reflective layer, as the top metal layer 1024 serves to reflect green light to exit out of the bottom of the structure, via the transparent substrate 1002. Beneficially, the partially reflective layer 1014 has the reflectivity properties 1100, whereby blue light is reflected and green light is transmitted through it. Upon the formation of appropriate electrical contacts, improved light emission from the structure is provided.

Figure 4B:
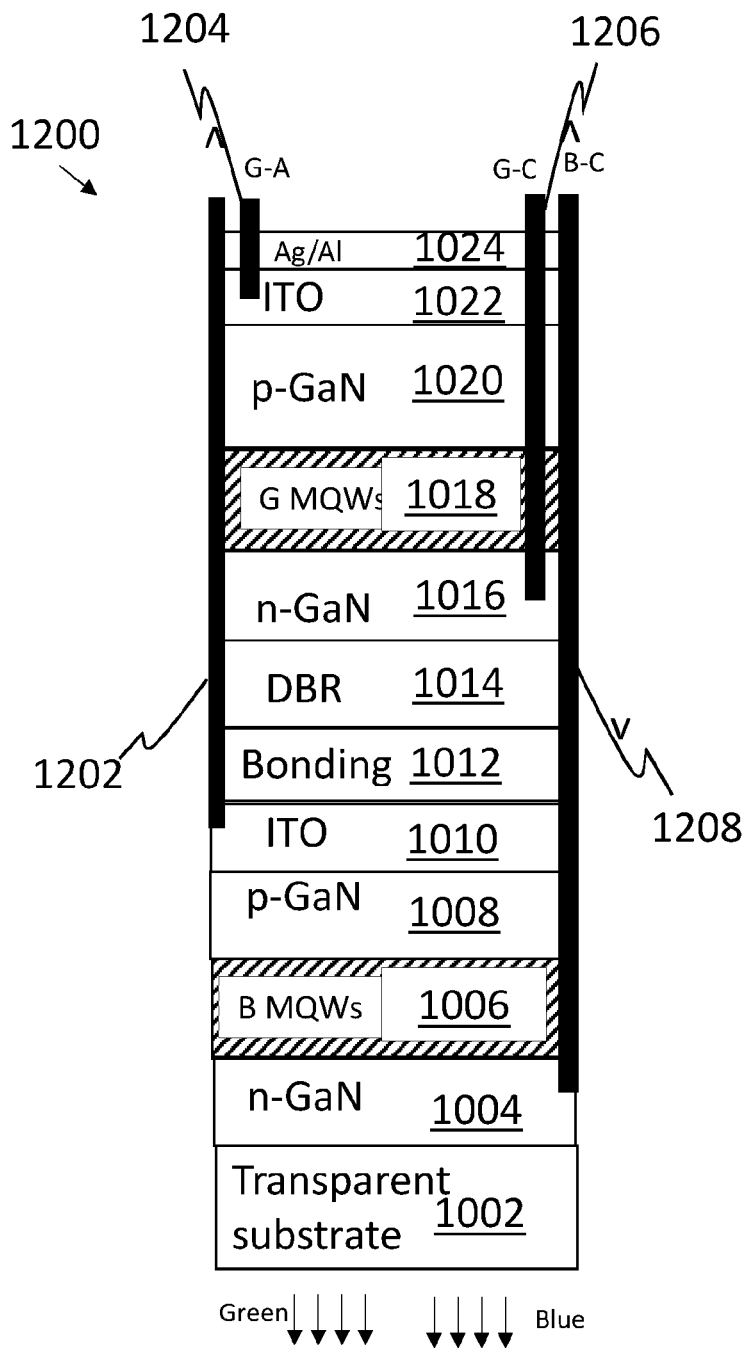
FIG. 4B shows a cross-sectional view of a dual colour LED.

FIG. 4B shows the structure 1000 of FIG. 4A that has been processed in order to provide a dual colour LED 1200. The dual colour LED 1200 has electrical connections formed 1202, 1204, 1206, 2108 through the structure in an analogous manner to that described above. Accordingly, electrode pairs enable carrier injection into the light emitting regions 1018, 1006 (electrode pair 1204, 1206 in respect of the green light emitting region 1018, and an electrode pair 1202, 1208 in respect of the blue light emitting region 1006). A similar analogy is made for RGB LEDs, as described here.

Figure 5A:
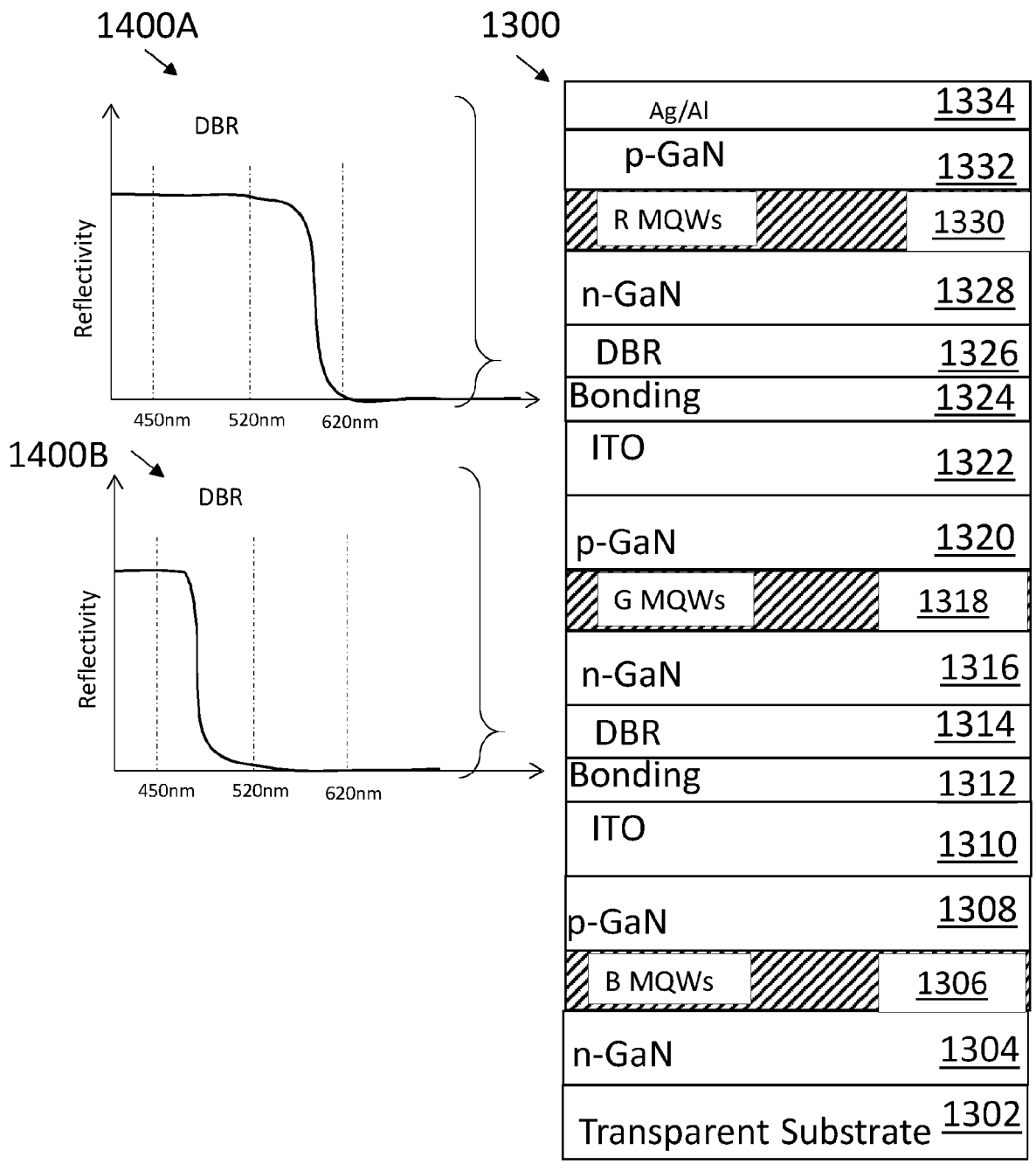
FIG. 5A shows a cross-sectional view of a RGB LED structure.

Whilst the structure described with reference to FIGS. 2 and 3 is configured in order to emit light from the top surface of the structure with respect to the original growth substrates defining the bottom, and hence starting point for subsequent growth of epitaxial layers, in other examples, the order of the light emitting regions is reversed. This is shown at FIG. 5A, for example. FIG. 5A shows a RGB light emitting structure 1300 formed on a transparent substrate 1302. In a similar manner as described above, a blue light emitting structure formed on a transparent substrate 1302 is bonded to a green light emitting structure using a bonding layer 1312 that bonds together the a partially reflective layer 1314 of the green light emitting structure and a transparent conductive layer 1310 of the blue light emitting structure. The red light emitting structure bonded to a green light emitting structure using a bonding layer 1324 that bonds together the a partially reflective layer 1326 of the red light emitting structure and a transparent conductive layer 1322 of the green light emitting structure. The red light emitting structure comprises a DBR 1326 on which an n-type layer 1328 is formed, on which a red light emitting region 1330 is formed, on which a p-type layer 1332 is formed.

The RGB colour light emitting structure has a transparent conductive layer (not shown) formed on the p-type region 1332 of the red light emitting structure and a reflective metal layer 1334 formed on the transparent conductive layer. Advantageously, this structure includes only two partially reflective layers, as the top metal layer 1334 serves to reflect red light to exit out of the bottom of the structure, via the transparent substrate 1302. Beneficially, the partially reflective layer 1326 has the reflectivity properties 1400A, whereby blue and green light (approximately 450 nm and 520 nm, respectively) are reflected and red light (approximately 620 nm) is transmitted through it. Beneficially, the partially reflective layer 1314 has the properties 1400B of reflecting blue light and allowing green and red light to transmit through it. Therefore, upon the formation of appropriate electrical contacts, improved light emission from the structure is provided.

Figure 5B:
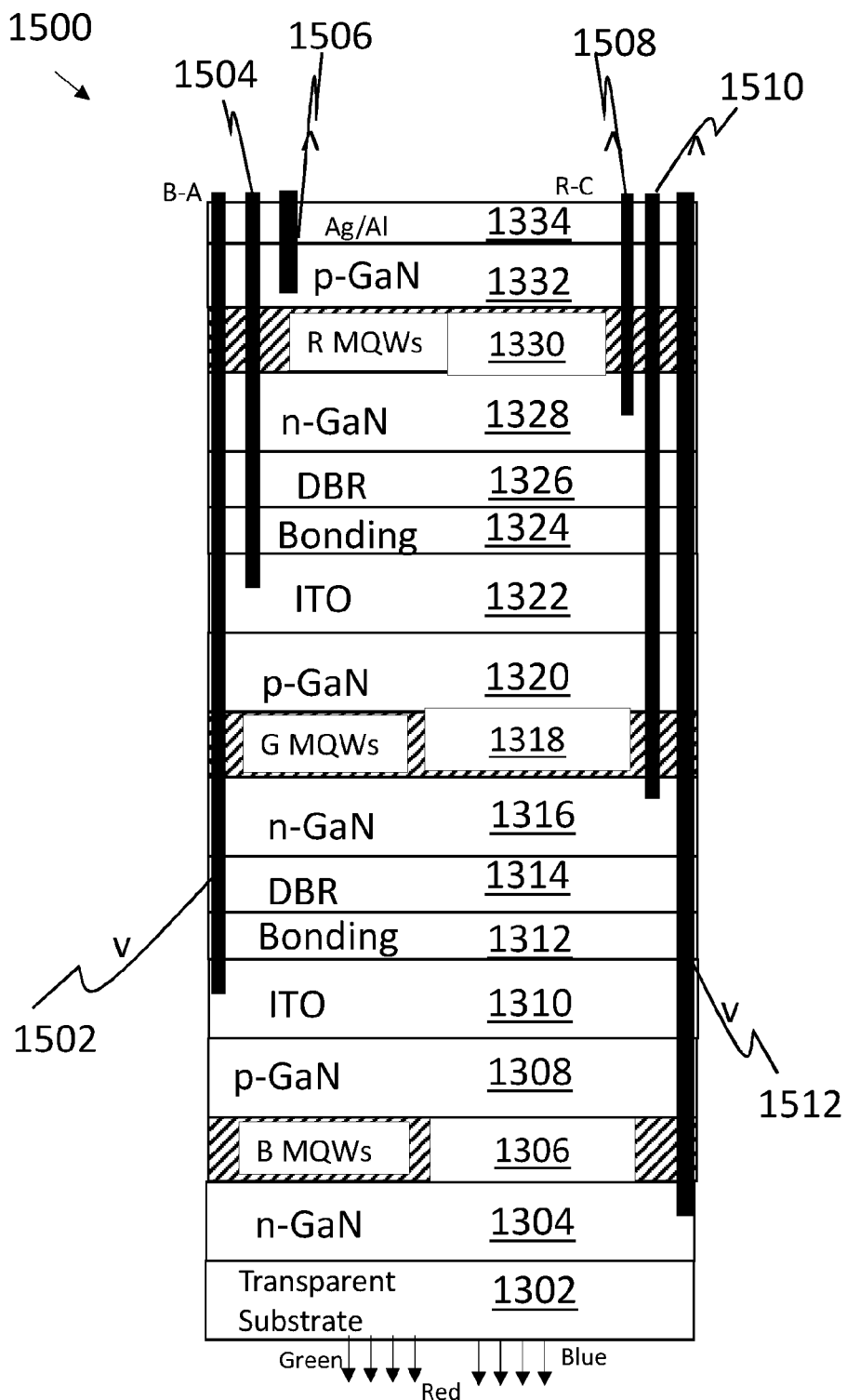
FIG. 5B shows a cross-sectional view of a RGB LED.

FIG. 5B shows the structure 1300 of FIG. 5A that has been processed in order to provide a dual colour LED 1500. The dual colour LED 1500 has electrical connections formed through the structure in an analogous manner to that described above. Accordingly, electrode pairs enable carrier injection into the light emitting regions 1306, 1318, 1330.

The invention claimed is:

1. A method of forming a light emitting structure comprising:
    forming a first light emitting diode comprising a first light emitting region configured to emit light having a first primary peak wavelength;
    forming a second light emitting diode comprising a second light emitting region configured to emit light having a second primary peak wavelength, wherein the first primary peak wavelength is different to the second primary peak wavelength, wherein forming at least one of the first light emitting diode and the second light emitting diode comprises growing a plurality of epitaxial crystalline layers comprising at least part of a partially reflective layer;
    bonding the first light emitting diode to the second light emitting diode with an insulating bonding layer such that the partially reflective layer is
    positioned at least partially between the first light emitting region and the second light emitting region, wherein the partially reflective layer is configured to reflect light having the first primary peak wavelength emitted by the first light emitting region and allow light having the second primary peak wavelength emitted by the second light emitting region to pass through the partially reflective layer, wherein the partially reflective layer comprises a Distributed Bragg Reflector comprising alternating epitaxial crystalline layers with different porosities; and
    forming an electrode pair for each of the first light emitting diode and the second light emitting diode, thereby to enable independent control of light emission from each of the first light emitting region and the second light emitting region, wherein forming an electrode of the electrode pair comprises etching a via, forming an insulating surface on at least part of the inner wall of the via and forming a conductor at least partially within the via.

2. The method according to claim 1, wherein the second primary peak wavelength is longer than the first primary peak wavelength, and wherein forming the light emitting structure comprises forming a primary light emitting surface area wherein the light having the first primary peak wavelength and the second primary peak wavelength are emitted from the light emitting structure via the primary light emitting surface area.

3. The method according to claim 1, wherein the first light emitting device comprises a substrate, the method comprising removing the substrate of the first light emitting device thereby to provide a surface for bonding the first light emitting device to the second light emitting device.

4. The method according to claim 1, comprising disposing a transparent conductive layer on the first light emitting device.

5. The method according to claim 1, comprising growing the light emitting structure at least partially by metalorganic chemical vapour deposition.

6. The method according to claim 1, wherein the light emitting structure comprises a third light emitting region configured to emit light having a third primary peak wavelength, wherein the third primary peak wavelength is different to the first and second primary peak wavelengths, wherein the method comprises bonding a third light emitting device comprising the third light emitting region configured to emit light having the third primary peak wavelength to the second light emitting device comprising the second light emitting region configured to emit light having the second primary peak wavelength.

7. The method according to claim 6, wherein the third light emitting device is a light emitting diode device comprising a light emitting region, an n-type region and a p-type region, wherein the third light emitting region comprises at least one epitaxial quantum well and a further partially reflective layer positioned at least partially between the second light emitting region and the third light emitting region, wherein the further partially reflective layer is configured to reflect light having the first primary peak wavelength emitted by the first light emitting region and light having the second primary peak wavelength emitted by the second light emitting region and allow light having the third primary peak wavelength emitted by the third light emitting region to pass through.

8. The method according to claim 1, wherein bonding comprises using a handling device to facilitate positioning of the first light emitting device in relation to the second light emitting device.

9. The method according to claim 8, comprising removing the handling device after the first light emitting device and the second light emitting device have been bonded together.

10. The method according to claim 8, wherein the handling device is bonded on the opposite side of the light emitting structure to a substrate.

11. A light emitting structure comprising:
a first light emitting diode comprising a first light emitting region configured to emit light having a first primary peak wavelength;
a second light emitting diode comprising a second light emitting region configured to emit light having a second primary peak wavelength, wherein the first primary peak wavelength is different to the second primary peak wavelength, wherein at least one of the first light emitting device and the second light emitting device comprises a plurality of epitaxial crystalline layers comprising at least part of a partially reflective layer, wherein the first light emitting diode is bonded to the second light emitting diode with an insulating bonding layer such that the
partially reflective layer is positioned at least partially between the first light emitting region and the second light emitting region, wherein the partially reflective layer is configured to reflect light having the first primary peak wavelength emitted by the first light emitting region and allow light having the second primary peak wavelength emitted by the second light emitting region to pass through the partially reflective layer, wherein the partially reflective layer comprises a Distributed Bragg Reflector comprising alternating epitaxial crystalline layers with different porosities, wherein the light emitting structure comprises an electrode pair for each of the first light emitting diode and the second light emitting diode, wherein one or more of the electrodes of the electrode pairs comprises a via hole comprising an insulating surface on at least part of the inner wall of the via hole and a conductor at least partially within the via hole.

12. The light emitting structure according to claim 11, wherein the second primary peak wavelength is longer than the primary peak wavelength.

13. The light emitting structure according to any of claim 11, wherein the light emitting structure comprises a primary light emitting surface area wherein the light having the first primary peak wavelength and the second primary peak wavelength are emitted from the light emitting structure by the primary light emitting surface area.

14. The light emitting structure according to claim 11, wherein the first light emitting diode and the second light emitting diode each comprise a light emitting region, an n-type region and a p-type region, wherein the first light emitting region and the second light emitting region comprise at least one epitaxial quantum well.

15. The light emitting structure according to claim 11, wherein the light emitting structure comprises a Gallium Nitride based structure.

16. The light emitting structure according to claim 11, wherein the first light emitting device comprises a transparent conductive layer.

17. The light emitting structure according to claim 11, wherein the light emitting structure comprises a third light emitting region configured to emit light having a third primary peak wavelength, wherein the third primary peak wavelength is different to the first and second primary peak wavelengths, wherein the third light emitting device comprising the third light emitting region configured to emit light having the third primary peak wavelength is bonded to the second light emitting device comprising the second light emitting region configured to emit light having the second primary peak wavelength, wherein the third light emitting device is a light emitting diode device comprising a light emitting region, an n-type region, a p-type region and at least one epitaxial quantum well.

18. The light emitting structure according to claim 17, comprising a further partially reflective layer positioned at least partially between the second light emitting region and the third light emitting region, wherein the further partially reflective layer is configured to reflect light having the first primary peak wavelength emitted by the first light emitting region and light having the second primary peak wavelength emitted by the second light emitting region and allow light having the third primary peak wavelength emitted by the third light emitting region to pass through.

* * * * *